(12) United States Patent
Brown et al.

(10) Patent No.: US 9,406,886 B2
(45) Date of Patent: Aug. 2, 2016

(54) SEMICONDUCTOR COMPOUNDS

(75) Inventors: Beverley Anne Brown, Warrington (GB); Simon Dominic Ogier, Ripon (GB); Marco Palumbo, Durham (GB); Keri Laura McCall, Ripon (GB); Raymond Fisher, High Peak (GB); Michael James Simms, High Peak (GB); Neil David Forrest, High Peak (GB); Aaron James Page, High Peak (GB); Stuart Edmund Willetts, High Peak (GB); Julie Diane Ellis Jones, Abingdon (GB)

(73) Assignee: Neudrive Limited, Macclesfield (GB)

( * ) Notice: Subject to any disclaimer, the term of this patent is extended or adjusted under 35 U.S.C. 154(b) by 0 days.

(21) Appl. No.: 14/119,509

(22) PCT Filed: May 24, 2012

(86) PCT No.: PCT/GB2012/051169
§ 371 (c)(1),
(2), (4) Date: Jan. 6, 2014

(87) PCT Pub. No.: WO2012/160382
PCT Pub. Date: Nov. 29, 2012

(65) Prior Publication Data
US 2014/0114040 A1    Apr. 24, 2014

(30) Foreign Application Priority Data

May 26, 2011 (GB) .................................. 1108865.5
Nov. 1, 2011 (GB) .................................. 1118868.7

(51) Int. Cl.
*C08G 61/12* (2006.01)
*H01L 51/00* (2006.01)

(52) U.S. Cl.
CPC .......... *H01L 51/0035* (2013.01); *C08G 61/128* (2013.01); *H01L 51/0043* (2013.01)

(58) Field of Classification Search
CPC H01L 51/0035; H01L 51/0043; C08G 61/12; C08G 61/128
See application file for complete search history.

(56) References Cited

U.S. PATENT DOCUMENTS

| | | | |
|---|---|---|---|
| 6,630,566 B1 * | 10/2003 | Allen et al. ..................... | 528/422 |
| 6,653,510 B1 * | 11/2003 | Brown et al. ................... | 564/431 |
| 6,690,029 B1 | 2/2004 | Anthony et al. | |
| 6,861,502 B1 * | 3/2005 | Towns et al. ................... | 528/422 |
| 6,994,941 B2 | 2/2006 | Tanaka et al. | |
| 7,514,710 B2 * | 4/2009 | Vogel .................. H01L 51/0055 | 257/17 |
| 8,119,804 B2 | 2/2012 | Brown et al. | |
| 2001/0026878 A1 * | 10/2001 | Woo et al. ..................... | 428/690 |
| 2003/0068527 A1 * | 4/2003 | Noguchi et al. .............. | 428/690 |
| 2003/0116755 A1 | 6/2003 | Takahashi | |
| 2004/0004433 A1 * | 1/2004 | Lamansky et al. ............ | 313/506 |
| 2004/0028944 A1 | 2/2004 | Mori et al. | |
| 2004/0222412 A1 | 11/2004 | Bai et al. | |
| 2005/0067951 A1 | 3/2005 | Richter et al. | |
| 2005/0153167 A1 * | 7/2005 | Suzuki et al. .................. | 428/690 |
| 2006/0093852 A1 * | 5/2006 | Marsitzky et al. ............. | 428/690 |
| 2006/0105492 A1 * | 5/2006 | Veres et al. ...................... | 438/99 |
| 2006/0154384 A1 * | 7/2006 | Murphy et al. .................... | 438/7 |
| 2006/0210827 A1 * | 9/2006 | Becker et al. ................. | 428/690 |
| 2007/0146426 A1 | 6/2007 | Nelson et al. | |
| 2007/0158646 A1 | 7/2007 | Reichmanis et al. | |
| 2008/0217605 A1 * | 9/2008 | Wallace et al. .................. | 257/40 |
| 2008/0309229 A1 * | 12/2008 | Steudel et al. ................. | 313/504 |
| 2009/0206329 A1 * | 8/2009 | Yamaga et al. .................. | 257/40 |
| 2009/0247728 A1 * | 10/2009 | Pan et al. ....................... | 528/380 |
| 2010/0096978 A1 * | 4/2010 | Wilson .......................... | 313/504 |
| 2010/0127220 A1 | 5/2010 | Tierney et al. | |
| 2010/0165604 A1 * | 7/2010 | Uetani .......................... | 362/97.3 |
| 2010/0256328 A1 * | 10/2010 | Heckmeier et al. ........... | 528/396 |
| 2012/0037889 A1 * | 2/2012 | Tanaka et al. ................... | 257/40 |
| 2012/0193611 A1 * | 8/2012 | Chen et al. ...................... | 257/40 |
| 2014/0175409 A1 * | 6/2014 | Brown et al. .................... | 257/40 |
| 2014/0183414 A1 * | 7/2014 | Umemoto et al. ............. | 252/500 |
| 2014/0231717 A1 * | 8/2014 | Sakakibara et al. .......... | 252/500 |
| 2014/0367617 A1 * | 12/2014 | Yoshida et al. ............... | 252/500 |
| 2015/0014599 A1 | 1/2015 | Griffiths | |
| 2015/0028313 A1 * | 1/2015 | Pillow et al. .................... | 257/40 |
| 2015/0069303 A1 * | 3/2015 | Eckes et al. ................... | 252/500 |

FOREIGN PATENT DOCUMENTS

| | | |
|---|---|---|
| EP | 1340270 A1 | 9/2003 |
| EP | 1394617 A2 | 3/2004 |
| EP | 1729357 A2 | 12/2006 |
| GB | 2491810 A | 12/2012 |
| JP | 2009003157 A | 1/2009 |
| JP | 2010502807 A | 1/2010 |
| TW | 201319121 A | 5/2013 |
| WO | WO-9715173 A1 | 4/1997 |
| WO | WO-99/32537 A1 | 7/1999 |
| WO | WO-9932537 A1 | 7/1999 |
| WO | WO-02/45184 A1 | 6/2002 |
| WO | WO-03052841 A1 | 6/2003 |
| WO | WO-2004102690 A2 | 11/2004 |

(Continued)

OTHER PUBLICATIONS

Wolfbauer, Georg, "International Search Report" prepared for PCT/GB2012/051170, as mailed Aug. 10, 2012, 3 pages.

(Continued)

*Primary Examiner* — Liam J Heincer
(74) *Attorney, Agent, or Firm* — Winstead PC

(57) ABSTRACT

This invention comprises a semiconducting polymer having a permittivity greater than 3.4 at 1000 Hz and a charge mobility in the pure state greater than $10^{-7}$ cm$^2$V$^{-1}$s$^{-1}$ and more preferably greater than $10^{-6}$ cm$^2$V$^{-1}$s$^{-1}$. Preferred polymers include repeating units of triarylamines which have specific cyano and/or alkoxy substitution. They are suitable for use in electronic components such as organic thin film transistors.

6 Claims, 1 Drawing Sheet

(56) References Cited

FOREIGN PATENT DOCUMENTS

| | | |
|---|---|---|
| WO | WO-2005055248 A2 | 6/2005 |
| WO | WO-2006123596 A1 | 11/2006 |
| WO | WO-2007078993 A1 | 7/2007 |
| WO | WO-2007082584 A1 | 7/2007 |
| WO | WO-2008029155 A2 | 3/2008 |
| WO | WO-2008107089 A1 | 9/2008 |
| WO | WO-2009155106 A1 | 12/2009 |
| WO | WO-2011090953 A1 | 7/2011 |
| WO | WO-2012160382 A1 | 11/2012 |
| WO | WO-2012160383 A1 | 11/2012 |
| WO | WO-2012164282 A1 | 12/2012 |

OTHER PUBLICATIONS

Madhavan, Nandita, "Small Molecule Organic Semiconductors", Organic Chemistry Seminar Abstracts 2001-2002 Semester II, University of Illinois, Apr. 1, 2002, pp. 49-56.

Chua, Lay-Lay, "General observation of n-type field-effect behaviour in organic semiconductors", Nature, vol. 434, Mar. 2005, pp. 194-198.

Bedekar, Beena A. et al, "Dielectric relaxation of cyanoethylated poly (2,3-dihydroxypropyl methacrylate)", Polymer vol. 36 No. 25, 1995, pp. 4735-4740.

Facchetti, Antonio et al., "Gate Dielectrics for Organic Field-Effect Transistors: New Opportunities for Organic Electronics", Advanced Materials 17, 2005 pp. 1705-1725.

Starling, S.G., et al.; "Physics"; 1950; pp. 946-947.

Sheraw, Chris D., et al.; "Functionalized Pentacene Active Layer Organic Thin-Film Transistors"; Advanced Materials, vol. 15, No. 23; Dec. 3, 2003; pp. 2009-2011.

Wolfbauer, Georg, "International Search Report" for PCT/GB2012/051169, as mailed Aug. 10, 2012, 4 pages.

Veres, Janos, et al.; "Gate Insulators in Organic Field-Effect Transistors"; Chem. Mater, vol. 16; Sep. 11, 2004; pp. 4543-4555.

\* cited by examiner

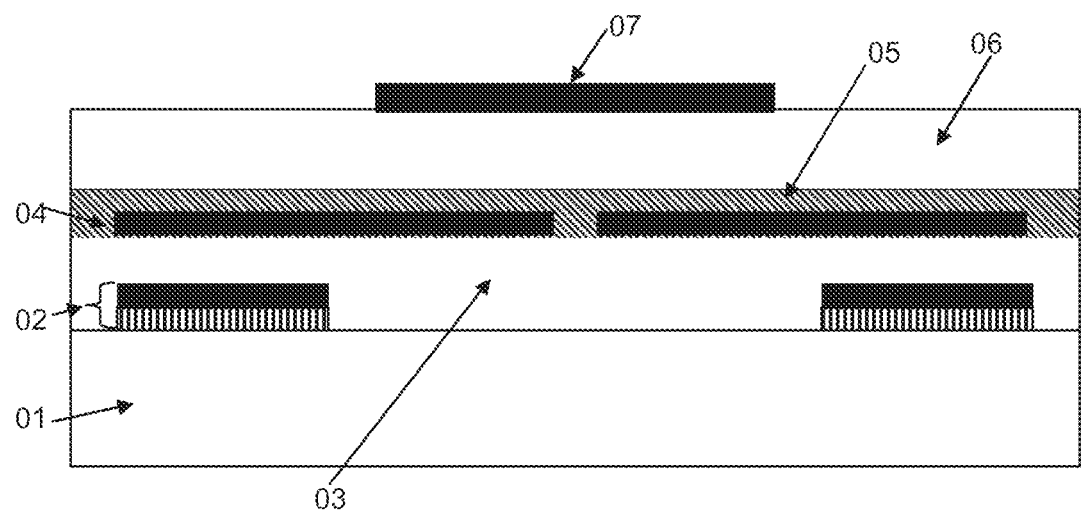
: Diagram of OTFT made on a glass substrate coated with SU8 layer
Layer 1- Glass substrate
Layer 2- Bottom contact pads
Layer 3 – SU8 ((2002; negative epoxy-type negative, near UV photoresist material, supplied by MicroChem Inc.) Layer 4 – Source, drain electrodes
Layer 5 –OSC layer
Layer 06-Dielectric layer
Layer 07-Gate electrode

SEMICONDUCTOR COMPOUNDS

This invention relates to novel semiconducting polytriarylamine polymers.

Polyarylamine and polytriarylamine compounds have been known for many years and have useful properties causing them to be used in electronic devices. Among their useful properties is that these compounds are semiconductors.

In recent years research into polyarylamines has centred around producing compounds having improved charge mobility. A considerable body of prior art exists relating to polyarylamine polymers. The most relevant prior art is Application number WO 1999/32537 which is primarily concerned with photoelectric effects and use of these compounds in the field of electrophotography. This specification reviews a large body of earlier work related to polyarylamines and as its inventive step proposes a method of making polyarylamines using end capping agents to control the molecular weight of said compounds. The compounds of the present invention may or may not be end capped. (WO199/32537) claims among other things a range of substituents including nitrilo, nitro, cyano and $C_1$-$C_4$ alkoxy substitution and "carbyl derived" substituents which from the text on page 21 would seem to cover a very wide range of compounds. Both polymers and copolymers are covered (see page 20). The inventors of patent application (WO199/32537) have not referred to or recognised any significance relating to the dielectric constant of the compounds and have not disclosed how an increase in permittivity could be achieved.

Subsequent workers in the field of organic electronics have used polyarylamines in combination with non-polymeric organic semiconductors but have specifically rejected binders which have permittivity above 3.3 at 1000 Hz (see WO02/45184 and WO 2005/055248). In WO 2007/078993 further attempts to use binders of permittivity greater than 3.3 produced very poor charge mobilities which are a critical aspect of the performance of semiconductors formulations used in organic field effect transistors.

We have discovered a novel class of polytriarylamines which have increased permittivity which is believed to alter their polarity and surface properties and increase their attractiveness for use as semiconducting binders used in combination with non-polymeric semiconductors.

Co-pending PCT and Taiwanese patent applications entitled "Transistors and Methods of Making Them" of common filing date and filed by The Centre For Process Innovation Ltd provide further information relating to this. The co-pending application and the present application share common priority dates of 26 May 2011 and 1 Nov. 2011, the application numbers of the priority documents of the co-pending application in the United Kingdom being respectively 1108865.5 and 1118868.7.

This invention comprises a semiconducting polymer represented by Formula (I) having a permittivity greater than 3.4 preferably at least 3.5 and suitably at least 3.7, for example at least 4.1 at 1000 Hz and a charge mobility in the pure state of greater than $10^{-7}$ cm$^2$V$^{-1}$ s$^{-1}$ more preferably greater than $10^{-6}$ cm$^2$V$^{-1}$s$^{-1}$ for example greater than $10^{-5}$ cm$^2$V$^{-1}$s$^{-1}$. In general the higher the charge mobility the better.

Preferred polymers are those of Formula (I) which can be homopolymers or copolymers. Copolymers are those polymers prepared from two or more different monomers and include terpolymers, tetrapolymers and the like. The monomers can join to form random, block, or segmented copolymers, as well as any variety of other structural arrangements.

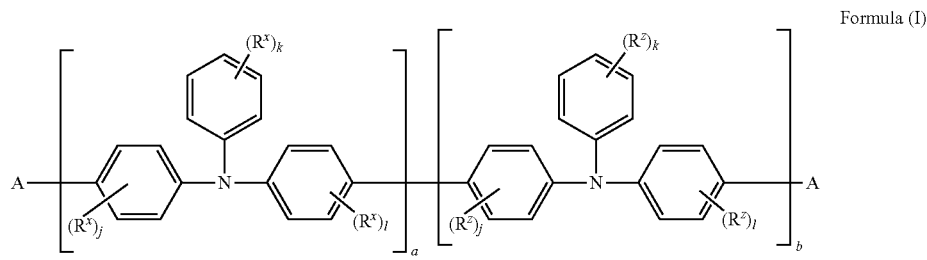

Formula (I)

The invention comprises a polytriarylamine polymer of Formula (I) wherein:

$R^x$ is independently hydrogen, an alkyl group preferably having 1 to 10 carbon atoms, an alkoxy group preferably having 1 to 10 carbon atoms, halogen, a nitro group or $R^y$; where each $R^y$ is independently a cyano group (CN), or an organic group that includes at least one CN group, with the proviso that at least one repeat unit and preferably at least 30 percent of the repeat units in the triarylamine polymer includes an $R^y$ group and that the sum of indices (j+k+l) is at least one. Sufficient groups $R^y$ should be present in the polymer to ensure that its permittivity is greater than 3.4 at 1000 Hz. It will be appreciated that the $R^x$ groups may not be the same in all of the repeat units of the first part of Formula 1.

$R^z$ is independently in each occurrence an alkyl group and is intended to include not only pure open chain saturated hydrocarbon alkyl substituents such as methyl, ethyl, propyl, t-butyl and the like, but also alkyl substituents bearing further substituents known in the art, such as hydroxyl, alkoxy, alkylsulphonyl, halogen atoms, cyano, nitro, amino, carboxyl, etc. Thus "alkyl group" includes ether groups, haloalkyls, etc. Preferred $R^z$ groups include $C_1$-$C_{20}$ hydrocarbyl groups, and more preferably $C_1$-$C_5$ alkyl groups, more preferably methyl groups, Different selections from the alternatives within the definitions of $R^x$ and $R^y$ may be made in different units of the polymer.

A is independently in each occurrence hydrogen, halogen or any suitable end-capping group including those described in WO 1999/32537, j and l are independently in each occurrence 0 to 4, k is independently in each occurrence 0 to 5, more preferably the sum of indices (j+k+l), which may differ between different monomer units is at least 1 in at least 10% of the monomer units.

a is the number of monomer units of Formula (II) in the polytriarylamine compound, if it is a homopolymer then the polymer will have 100% of monomer of Formula (II). The copolymers preferably comprise between 5-100% of monomer of Formula (II), more preferably 10-80% of monomer of Formula (II), still more preferably 30-70% of monomer of Formula (II), b is the number of monomer units of monomer of Formula (III) in the polytriarylamine compound, in some cases b will equal 0, X is a halogen, for example Br or I but more preferably Cl.

* (asterisk)—represents halogen atoms or a suitable leaving group

As used herein, the term "organic group" means a carbon atom, a hydrocarbon group (with optional elements other than carbon and hydrogen, such as cyano, oxygen, nitrogen, sulphur, silicon and halogens) that is classified as an aliphatic group, cyclic group, or combination of aliphatic and cyclic groups (e.g. alkaryl and aralkyl groups). The term aliphatic group means a saturated or unsaturated linear or branched hydrocarbon group. This term is used to encompass alkyl, alkenyl, and alkynyl groups for example. The term "alkyl" group means a saturated linear or branched hydrocarbon group including for example, methyl, ethyl, isopropyl, t-butyl, hexyl, heptyl, 2-ethylhexyl and the like. The term "alkenyl group" means an unsaturated linear or branched hydrocarbon group with one or more carbon-carbon double bonds, such as a vinyl group. The term "alkynyl group" means an unsaturated linear or branched hydrocarbon group with one or more carbon-carbon triple bonds. The term "cyclic group" means a closed ring hydrocarbon group that is classified as an alicyclic, aromatic, or heterocyclic group. The term "alicyclic group" means a cyclic hydrocarbon having properties resembling those of aliphatic groups. The term "aromatic group" or aryl group means a mono- or polynuclear aromatic hydrocarbon group, including within its scope alkaryl or aralkyl groups. The term "heterocyclic group" means a closed ring hydrocarbon in which one or more of the atoms in the ring is an element other than carbon (e.g. nitrogen, oxygen, sulphur, etc.).

The number average molecular weight of the polymers is suitably in the range 1000 to 500,00 for example 5000 to 100,000.

For certain embodiments, the semiconducting polymer includes a group that can be cross-linked and on cross-linking and patterning thereby renders the semiconducting layer less susceptible to dissolution when layers are solution coated on top of it.

The polytriarylamine copolymers thus comprise repeat units of Formulae (II) and (III) of which at least some are substituted by cyano groups or by groups which comprise cyano groups or alkoxy groups.

The polymer preferably has cyano substitution on any of the aromatic rings in the polytriarylamine units; more preferably if cyano groups are directly substituted onto the aromatic ring they should be in the 2 and/or 6 positions relative to the nitrogen atom. It is preferred that such cyano substitution is on the "pendant" aromatic ring, that is, the aromatic ring which is not directly bonded into the polymer 'backbone' chain. It is also preferred that the cyano group should be attached indirectly through a linking group.

In another preferred case the polymer preferably has alkoxy substituents directly substituted onto the aromatic ring. These substituents should be in the 2, 4, and/or 6 positions relative to the nitrogen atom. It is more preferred that such alkoxy substitution is on the "pendant" aromatic ring. If a cyano group is also present it is preferred that the cyano group is in the 2-position on the pendant aromatic ring.

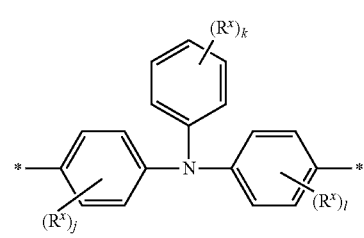

Formula (II)

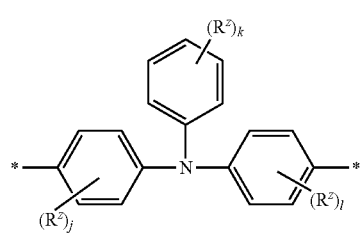

Formula (III)

In a most preferred case, $R^x$ is a group having a linker group between the pendant aromatic ring and a cyano group. The linker group may be an alkyl group, a substituted alkyl group (for example —CH$_2$CN, —CR$_2$—CN) which is substituted with at least one additional cyano group. The linker group may be a phenylene group which may be substituted for example by an additional CN group; suitably $R^x$ may be a group of formula —C$_6$H$_4$CN, —C$_6$H$_4$—CH$_2$CN or —C$_6$H$_4$—(CR$_2$)CN.

A preferred repeat unit is represented by Formula (IIa)

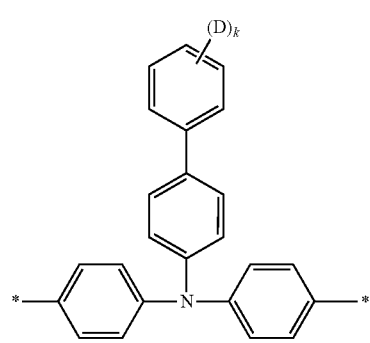

Formula (IIa)

in which the group or groups D are independently CN groups or groups which comprise a CN group attached to the aromatic ring by a linking group, and/or D are alkoxy groups.

In one embodiment, of the invention, polymers of Formula (I) have one or two of the $R^x$ groups preferably as a cyano group, preferably in the 2,4 and/or 6 positions on the pendant aromatic ring. Most preferably one cyano group is located on the 2-position on the pendant aromatic ring (see Example 1).

In another preferred case $R^x$ is a methoxy group on the pendant aromatic ring in polymers of Formula (I), in this case k is preferably >1 and more preferably the methoxy groups are substituted on the 2 and 4-positions on the pendant aromatic ring (see Example 2).

If a cyano group is also present it is preferred that the cyano group is in the 2-position.

PREPARATIVE EXAMPLES 1 TO 9 AND COMPARATIVE EXAMPLES 10 TO 15

NMR data was collected using instruments supplied by JEOL, specifically models ECX 300 and ECX 400.

All solvents used were of HPLC grade, unless otherwise stated.

Silica gel purifications were carried out using Davisil® 60 Å 40-63 µm, a product of Grace Davison Discovery Sciences, unless otherwise stated.

The number average molecular weight (Mn) quoted in the Examples herein were determined by gel permeation chromatography using a Hewlett Packard 1100 HPLC system with UV detection @ 254 nm, liquid chromatography data was processed using a CIRRUS GPC-Multi detector software calibrated against polystyrene standards (supplied by Varian 13 points molecular weight range 162-113300).

Also for convenience the Examples herein which are polymers are identified by the substituents on the aromatic rings in the repeat unit (for example 2-cyano-polytriarylamine polymer). Examples 1 to 8 and Comparative Example 10 to 15 were all synthesised by polymerising the corresponding dihalo substituted monomer(s), no end-capping reagent as defined in WO 1999/32537 was used in this invention. Example 9 was synthesised using Suzuki polymerisation. The polymerisation method described in WO 1999/32537 is equally applicable to preparing the polymers of this invention.

Method for the Measurement of the Permittivity, $\epsilon_r$ of the Polymers

The permittivities of the semiconducting polymers in Examples 1 to 9 and in the Comparative Examples 10 to 15 were measured by fabricating capacitors according to the method detailed below.

50 nm titanium bottom contact pads were prepared using sputter coating and standard photolithography and wet etching techniques. The semiconducting polymer of interest was then coated from solution, using a spin coater, to obtain a film thickness of typically greater than 500 nm. The solvents used to dissolve the materials are shown in the text below. A top contact pad of approximately 50 nm aluminium was then deposited using shadow mask evaporation. The capacitance was measured using a calibrated Agilent Precision LCR meter E4980A set at a frequency of 1000 Hz. Film thickness measurements were performed using a Dektak surface profilometer and cross correlated with a Taylor Hobson Talysurf CCl white light interferometer. The two techniques were found to agree to within +/−3% for all films studied. The area of overlap for the top and bottom contact pads, i.e. the area of the capacitor formed, was measured using a Zeiss stereo microscope equipped with image analysis software. Using these values the permittivities were then calculated using the equation:

$$\varepsilon_r = \frac{C \cdot d}{A \cdot \varepsilon_0} \quad \text{Equation 1}$$

Equation 1: Calculation of permittivity.
Where,
$\epsilon_r$ is the permittivity of the polytriarylamine analogue
C is the measured capacitance of the capacitor
d is the thickness of the film of the polytriarylamine analogue
A is the area of the capacitor and $\epsilon_o$ is the permittivity of free space (a constant with a value of $8.854 \times 10^{-12}$ F/m).

The capacitor array used contains 64 capacitors with areas of 0.11 cm² and 0.06 cm² respectively (32 of each size). The standard deviation for the value of permittivity on each array was calculated, which includes the standard deviation of capacitance, film thickness and area measurement combined. In addition, where possible, each semiconducting polymer was tested at two different film thicknesses to confirm that the permittivity value did not vary with film thickness.

Permittivity Data

Using the above described method the data included in Table 1 was obtained.

TABLE 1

Details of capacitor arrays fabricated and measured for each polymer

| Polymer (Polytriarylamine = PTAA) | Average Film Thickness, nm | Permittivity, $\epsilon_r$ (s.d, %) |
|---|---|---|
| 2-Cyano-PTAA homopolymer Example (1) | 767[c] | 3.88 (2.2) |
| | 736[c] | 3.64 (2.3) |
| | 758[c] | 3.97 (3.2) |
| 2,4-DiMeO-PTAA homopolymer Example (2) | 2195[d] | 4.09 (3.9) |
| | 659[c] | 3.77 (0.9) |
| | 645[c] | 3.70 (2.3) |
| | 404[q] | 3.84 (0.8) |
| 4-isopropylcyano-PTAA homopolymer Example (3) | 998[e] | 5.80 (2.3) |
| | 936[e] | 6.04 (1.1) |
| | 481[f] | 5.86 (3.9) |
| 50:50 random copolymer of 4-isopropylcyano PTAA: 2,4-dimethyl-PTAA Example (4) | 706[a] | 4.05 (5.1) |
| | 466[b] | 4.07 (2.6) |
| | 467[b] | 4.05 (1.0) |
| 30:70 random copolymer of 4-isopropylcyano PTAA: 2,4-dimethyl-PTAA Example (5) | 606[o] | 3.73 (2.1) |
| | 604[o] | 3.66 (0.4) |
| | 453[p] | 3.63 (1.3) |
| 2,4-Dimethoxyphenyl-PTAA homopolymer Example (6) | 897[r] | 3.47 (2.2) |
| | 893[r] | 3.55 (0.7) |
| | 574[s] | 3.50 (1.8) |
| | 573[s] | 3.52 (1.8) |
| 50:50 copolymer of 4-isopropylcyanophenyl-PTAA: 2,4-Dimethyl-PTAA Example (7) | 1057[r] | 4.13 (0.96) |
| | 966[r] | 3.92 (1.56) |
| | 535[s] | 3.88 (2.08) |
| | 546[s] | 4.22 (4.16) |
| 4-cyclohexylcyano-PTAA homopolymer Example (8) | 520[u] | 4.12 (12.8) |
| | 293[v] | 4.0 (18.9) |
| | 282[v] | 4.10 (11.4) |
| 70:30 2,4-Dimethyl-PTAA: 4-isopropylcyano-PTAA Bis-aryl end terminated copolymer Example (9) | 460[o] | 3.52 (0.98) |
| | 458[o] | 3.55 (4.13) |
| | 368[p] | 3.66 (6.52) |
| | 367[p] | 3.69 (2.97) |
| 2,4-Dimethyl-PTAA homopolymer Comparative Example (10) | 10641[g,h] | 3.08 (8.3) |
| | 9307[g,h] | 3.00 (12.8) |
| | 12510[h,i] | 2.99 (9.3) |
| 3-Methoxy-PTAA homopolymer Comparative Example (11) | 12547[i,j] | 3.29 (10.5) |
| | 9575[i,j] | 3.29 (8.4) |
| 2,4-Difluoro-PTAA homopolymer Comparative Example (12) | 883[k,l] | 3.22 (2.6) |
| | 846[k,l] | 3.32 (3.8) |
| | 614[g,l] | 3.24 (2.9) |
| 3,5-bis(trifluoromethyl)-PTAA homopolymer Comparative Example (13) | 730[k,m] | 2.80 (2.12) |
| | 756[k,m] | 2.84 (3.5) |
| Backbone-2-Methoxy-PTAA homopolymer Comparative Example (14) | 453[o] | 3.30 (2.32) |
| | 436[o] | 3.28 (2.67) |
| | 365[y] | 3.26 (0.75) |
| | 378[y] | 3.33 (1.50) |
| 4-Phenoxy-PTAA homopolymer Comparative Example (15) | 826[w] | 2.90 (4.9) |
| | 435[x] | 2.59 (3.8) |

[a] 5 wt % of polymer formulated in tetralin, coated at 300 rpm, 20 s
[b] 5 wt % of polymer formulated in tetralin, coated at 500 rpm, 20 s
[c] 5 wt % of polymer formulated in o-dichlorobenzene, coated at 300 rpm, 20 s
[d] 10 wt % of polymer formulated in o-dichlorobenzene, coated at 300 rpm, 20 s
[e] 3 wt % of polymer formulated in dichloromethane, coated at 300 rpm, 20 s
[f] 2 wt % of polymer formulated in dichloromethane, coated at 300 rpm, 20 s
[g] Prepared using gold top and bottom contacts and capacitors with an area of 0.24 cm²
[h] 10 wt % of polymer formulated in toluene, coated at 700 rpm, 20 s
[i] Prepared using gold top and bottom contacts and capacitors with an area of 0.15 cm²
[j] 10 wt % of polymer formulated in tetralin, coated at 500 rpm, 20 s
[k] Prepared using gold top and bottom contacts and capacitors with an area of 0.11 and 0.06 cm²
[l] 10 wt % of polymer formulated in toluene, coated at 500 rpm, 20 s
[m] 5 wt % of polymer formulated in 50/50 vol THF/cyclohexanone, coated at 300 rpm, 20 s
[o] 5 wt % of polymer formulated in toluene, coated at 300 rpm, 20 s
[p] 5 wt % of polymer formulated in toluene, coated at 500 rpm, 20 s
[q] 5 wt % of polymer formulated in o-dichlorobenzene, coated at 500 rpm, 20 s
[r] 5 wt % of polymer formulated in bromobenzene, coated at 300 rpm, 20 s TABLE 1-continued Details of capacitor arrays fabricated and measured for each polymer

| Polymer (Polytriarylamine = PTAA) | Average Film Thickness, nm | Permittivity, $\epsilon_r$ (s.d, %) |
|---|---|---|

[s] 5 wt % of polymer formulated in bromobenzene, coated at 500 rpm, 20 s
[u] 3 wt % of polymer formulated in phenetole, coated at 100 rpm, 20 s
[v] 3 wt % of polymer formulated in phenetole, coated at 200 rpm, 20 s
[w] 7 wt % of polymer formulated in tetralin, coated at 300 rpm, 20 s
[x] 7 wt % of polymer formulated in tetralin, coated at 500 rpm, 20 s
[y] 5 wt % of polymer formulated in toluene, coated at 400 rpm, 20 s The mobillities of the polymers were measured via fabrication of OTFTs on glass as described below.

Method for Fabricating the Organic Thin Film Transistors (OTFTs) and for Characterising Mobility, ($\mu$) in cm$^2$/Vs OTFTs were fabricated in top gate configuration (refer to FIG. 1) using glass substrates. The method of fabrication is as described below.

Glass Based OTFT Devices

4″ square glass substrates (ex Corning Eagle 2000) were cleaned using sonication 20 minutes in Deconex (3% in water) followed by rinsing in ultrapure water and dried using compressed air. The source and drain metal (Au 50 nm on top of Ti 5 nm) was sputter coated onto the glass. The source-drain (SD) electrodes were patterned using standard photolithography and wet chemical etching. The transistor SD pattern on the lithographic mask consisted of electrodes with channel lengths ranging from 4 µm, 10 µm, 30 µm, and 100 µm, and channel widths of 0.5 mm, 3 mm and 15 mm. The pattern was arrayed to produce 36 transistors of each channel length over a 4″ square substrate. Following inspection of the etched pattern, the photoresist material was stripped chemically and the SD channel lengths were measured using a compound microscope. The substrates then underwent plasma treatment (model PE100, ex Plasma Etch Inc.) using 50 sccm argon/50 sccm oxygen plasma and a RF power of 250 W, treatment time 60 s. Prior to spin coating of the OSC solution, a 10 mM solution of pentafluorobenzenethiol was applied to the surface of the electrodes for 1 minute followed by spin coating and rinsing in 2-propanol, followed by drying on a hotplate at 100° C. The organic semiconductor (OSC) formulation was spin coated onto the SD electrodes using a Suss RC12 spinner set at 1000 rpm followed by baking on a hotplate for 60 seconds at 100° C. A solution of 2 parts Cytop CTL 809M (Asahi Glass) to 1 part FC43 solvent (Acros Organics) was spin coated at 1500 rpm and the sample was baked on a hotplate for 60 s at 100° C. Gate electrodes were defined by evaporation of gold through a shadow mask in a thermal evaporator system.

OTFT Characterisation

OTFTs were tested using a Wentworth Pegasus 300S semi-automated probe station in conjunction with a Keithley S4200 semiconductor parameter analyser. This allowed a statistically significant number of OTFT device measurements to be made on each substrate. The Keithley system calculated the linear mobility according to the equation shown below (Equation 2)

$$\mu = \frac{\partial I_{DS}}{\partial V_G} \frac{L}{W C_i V_{DS}}$$

Where L is the transistor length, W is the transistor width and $C_i$ is the dielectric capacitance per unit area. $V_{ds}$ was set at −2V unless otherwise stated. The mobility values reported are an average of the 5 highest points in accumulation for each transistor. The standard deviation of the mobility values is reported as a percentage of the mean, and the number of devices measured is indicated in the table of results also.

TABLE 2

TFT mobility of each polymer, with polymer formulation details

| Polymer (Polytriarylamine = PTAA) | Polymer formulation | Mobility at 4 µm channel length, cm$^2$/Vs | Standard deviation of mobility, % | Number of working transistors tested on substrate (out of 36) |
|---|---|---|---|---|
| 2-cyano-PTAA homopolymer Example (1) | 1 wt % in bromobenzene | $1.2 \times 10^{-6}$ | 6.6 | 27 |
| 2,4-DiMeO-PTAA homopolymer Example (2) | 1 wt % in bromobenzene | $3 \times 10^{-4}$ | 11.7 | 12 |
| 4-isopropylcyano-PTAA homopolymer Example (3) | 1 wt % in dichloromethane | $1.1 \times 10^{-6}$ | 2.7 | 3 |
| 50:50 random copolymer, 4-isopropylcyano PTAA: 2,4-dimethyl-PTAA Example (4) | 1 wt % in tetralin | $8 \times 10^{-5}$ | 15.4 | 25 |
| 30:70 random copolymer, 4-isopropylcyano-PTAA: 2,4-dimethyl-PTAA Example (5) | 1 wt % in toluene | $1 \times 10^{-4}$ | 14.7 | 35 |
| 2,4-Dimethoxyphenyl-PTAA homopolymer Example (6) | 1 wt % in bromobenzene | $5 \times 10^{-4}$ | 5.5 | 19 |
| 50:50 copolymer of 4-isopropylcyano phenyl-PTAA: 2,4-Dimethyl-PTAA Example (7) | 1 wt % in bromobenzene | $1 \times 10^{-4}$ | 6.0 | 29 |

TABLE 2-continued

TFT mobility of each polymer, with polymer formulation details

| Polymer (Polytriarylamine = PTAA) | Polymer formulation | Mobility at 4 μm channel length, $cm^2/Vs$ | Standard deviation of mobility, % | Number of working transistors tested on substrate (out of 36) |
|---|---|---|---|---|
| 4-cyclohexylcyano-PTAA homopolymer Example (8) | 1 wt % in phenetole | $1 \times 10^{-5}$ | 9.5 | 13 |
| 70:30 2,4-Dimethyl-PTAA: 4-isopropylcyano-PTAA Bis-aryl end terminated copolymer from Suzuki coupling, Example (9) | 1 wt % in toluene | $1.7 \times 10^{-4}$ | 24.9 | 32 |
| 2,4-Dimethyl-PTAA homopolymer Comparative Example (10) | 1 wt % in toluene | $3.7 \times 10^{-3}$ | 12.7 | 27 |
| 3-Methoxy-PTAA homopolymer Comparative Example (11) | 1 wt % in tetralin | $8.4 \times 10^{-4}$ | 5.4 | 17 |
| 2,4-Difluoro-PTAA homopolymer Comparative Example (12) | 1 wt % in tetralin | $9.2 \times 10^{-5}$ | 29.8 | 25 |
| 3,5-bis(trifluoromethyl)-PTAA homopolymer Comparative Example (13) | 1 wt % in THF/Cyclohexanone (1:3 by volume) | $9.3 \times 10^{-6}$ | 26.8 | 18 |
| Backbone 2-methoxy PTAA homopolymer Comparative example (14) | 1 wt % in toluene | $6.8 \times 10^{-5}$ | 4.0 | 27 |
| 4-Phenoxy-PTAA homopolymer Comparative Example (15) | 1 wt % in tetralin | $1.1 \times 10^{-3}$ | 6.6 | 32 |

Preparative Examples 1 to 9

Example (1)

Synthesis of the 2-cyano-PTAA Polymer (1)

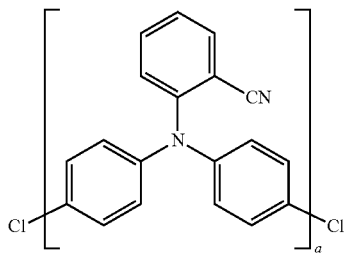

1(a) Synthesis of the 2-cyano monomer

A 500 milliliter (mL) 3-neck round bottom flask fitted with magnetic stirrer, thermometer, condenser and argon inlet was charged with 250 mL N-methylpyrrolidinone (GPR grade, Sigma Aldrich) which was then degassed for 15 minutes. 24.2 grams (g) of 2-fluorobenzonitrile (Fluorochem), 23.8 g of bis(4-chlorophenyl)amine (Example 3) and 30.4 g of caesium fluoride (Alfa-Aesar) were added to the vessel and was heated to 175° C. for 18 hours, before cooling to room temperature. The mixture was poured into water (1800 mL), extracting with toluene. The organic phase was dried (magnesium sulphate)(MgSO$_4$) and concentrated to give a brown solid. This material was slurried in methanol to give a tan solid, which was further purified by recrystallising from methanol and charcoal to give the product as a tan solid. Yield: 21 g. $^1$H NMR (400 MHz, CDCl$_3$): δ 7.6 (1H, m, ArH), 7.5 (1H, m, ArH), 7.3-7.15 (6H, m, ArH), 6.9 (4H, m, ArH)

Synthesis of the 2-cyano-PTAA homopolymer

A 500 ml three neck round bottom flask was fitted with overhead stirrer, thermometer, air condenser, Claisen adaptor and septum inlet. The apparatus was flushed with argon. 200 mL of anhydrous N,N-dimethylacetamide (Sigma Aldrich) was charged to the vessel via cannula needle and was degassed with argon for 15 minutes. Triphenylphosphine (7.78 g, Sigma Aldrich), 2,2'-bipyridyl (368 miligrams (mg), Sigma Aldrich), zinc (11.38 g, Alfa Aesar) and nickel (II) chloride (253 mg, Sigma Aldrich) were added to the vessel. The contents were heated to 70-80° C. where the mixture turned red-brown in colour. A few crystals of iodine were added, and the reaction was left to stir for 1 hour. The monomer (19.95 g) was added to the vessel. Anhydrous toluene (29 mL, Sigma Aldrich) was added, and the reaction was left to stir at 70-80° C. for 19 hours, before being cooled to room temperature. The reaction was filtered through celite, eluting with N,N-dimethylacetamide (50 mL). The filtrates were added dropwise to a stirred portion of methanol (1.5 liters (L)). The suspension was stirred for 1 hour, collected by vacuum filtration and washed with methanol. The filter cake was dissolved in dichloromethane (500 mL) and washed with 1M aqueous sodium hydroxide solution (250 mL), three times with water (3×250 mL), dried (sodium sulphate) (NaSO$_4$) and concentrated to give an orange solid. A solution of this material was prepared by dissolving the product in 120 mL of tetrahydrofuran at 50° C. and diluting with 60 mL of toluene. This solution was filtered through silica gel, eluting with 2:1 mixture of tetrahydrofuran: toluene (800 mL). The combined filtrates were concentrated to give a yellow solid. The material was dissolved in tetrahydrofuran (180 mL) and charged to a 500 mL round bottom flask equipped with magnetic stirrer and condenser. Activated charcoal (1.8 g) was added and the mixture was heated to 60° C. for 35 minutes. The mixture was filtered through filter paper in a Buchner funnel, washing with tetrahydrofuran. The carbon screening was repeated three times in total, filtering the third treatment through a glass sinter funnel. The filtrates were concentrated to give a yellow-orange solid. A solution of this material was prepared in tetrahydrofuran (100 mL) and added dropwise to a stirred portion of methanol (400 mL). The suspension was stirred for 1 hour, collected by vacuum filtration, washed with methanol and dried to constant weight to give the product as a yellow solid. This precipitation was then repeated, using 120 mL of LC tetrahydrofuran and 400 mL of methanol, to give the product as a yellow powder. Yield: 12.72 g. Mn=2514 g/mol. n=9.4. Polydispersity=2.0.

The dielectric constant of polymer (1) was 3.8.

Example (2)

Synthesis of the 2,4-dimethoxy-PTAA polymer (2)

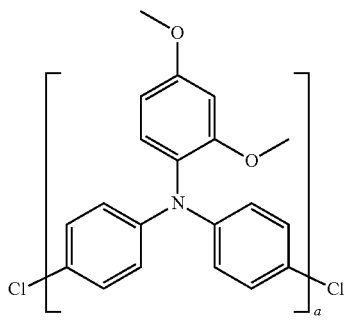

2(a): Synthesis of the 2,4-dimethoxy-PTAA monomer

A 2 liter (L) 3-neck round bottom flask fitted with magnetic stirrer, thermometer, argon inlet and condenser was charged with 875 mL of toluene, which was degassed for 15 minutes. 5.12 g of palladium (II) acetate (Precious Metals Online) and 13.19 g of 4,5-bis(diphenylphosphino)-9,9-dimethylxanthene (Alfa-Aesar) were charged to the vessel. The mixture was heated to 50° C. with stirring, and once the internal temperature reached 50° C., was cooled to room temperature. The mixture was left to stir at room temperature for 1 hour. 2,4-dimethoxyaniline (35 g, Alfa-Aesar), 4-chloroiodobenzene (119.70 g, Apollo Scientific) and sodium-tert-butoxide (48.25 g, Alfa-Aesar) were added and the reaction was heated to 95° C. for 18 hours. The reaction was cooled to room temperature and filtered through a silica pad. The filtrates were concentrated to give a brown solid. This material was recrystallised from isopropyl alcohol/acetone. After cooling, the solids were collected by vacuum filtration and washed three times with cold isopropyl alcohol/acetone. The solids were recrystallised further from dichloromethane/methanol to give the product as a brown solid. Yield: 30.95 g. $^1$H NMR (300 MHz, CDCl$_3$): δ 7.1 (4H, m, ArH), 6.8 (4H, m, ArH) 3.8 (3H, s, ArOMe), 3.6 (3H, s, ArOMe).

Synthesis of the 2,4-dimethoxy-PTAA polymer (2)

A 500 mLl three neck round bottom flask was fitted with overhead stirrer, thermometer, air condenser, Claisen adaptor and septum inlet. The apparatus was flushed with argon. 150 mL of anhydrous N,N-dimethylacetamide (Sigma Aldrich) was charged to the vessel via cannula needle and was degassed with argon for 15 minutes. Triphenylphosphine (5.36 g, Sigma Aldrich), 2,2'-bipyridyl (250 mg, Sigma Aldrich), zinc (8.1 g, Alfa-Aesar) and nickel (II) chloride (150 mg, Sigma Aldrich) were added to the vessel and the contents were heated to 70-80° C. The solution turned red-brown and a few crystals of iodine were added to the mixture. The reaction was left to stir for 1 hour at this temperature before the monomer (15 g) and anhydrous toluene (24 mL, Sigma Aldrich) was added. The reaction was left to stir at 70-80° C. for 19 hours. The reaction was cooled to room temperature and filtered through a celite pad, eluting with N,N-dimethylacetamide. The filtrate was added dropwise into a stirred portion of methanol (1250 mL). The suspension was stirred for 1 hour, before being collected by vacuum filtration. The solids were dissolved in dichloromethane (250 mL) and washed with 1M aqueous hydrochloric acid (200 mL), water (2×200 mL), dried (sodium sulphate) and concentrated to give an orange-yellow solid. This was dissolved in tetrahydrofuran (200 mL) and filtered through silica gel, eluting with tetrahydrofuran. The filtrates were combined and concentrated to give an orange solid. The material was dissolved in tetrahydrofuran (250 mL) and charged to a 500 mL round bottom flask fitted with magnetic stirrer and condenser. Activated charcoal (1.14 g) was added and the mixture was heated to 60° C. for 30 minutes. The mixture was filtered through filter paper in a Buchner funnel and washed with tetrahydrofuran. The carbon screening was repeated three times in total, filtering the third treatment through a glass sinter funnel. The filtrates were concentrated to give an orange-yellow solid. A solution of this material in tetrahydrofuran (64 mL) was added dropwise to a stirred portion of methanol (320 mL). The suspension was stirred for 45 minutes, before being collected by vacuum filtration, washed with methanol, and dried. This precipitation procedure was repeated a second time using tetrahydrofuran (95 mL) and methanol (475 mL) to give a yellow solid. This solid was then stirred in methanol (350 mL) for 2 hours and filtered. A final precipitation using tetrahydrofuran (60 ml) and methanol (300 mL) gave, after drying, the product as a yellow solid. Yield: 6.3 g. Mn=3471 g/mol. n=11.5. Polydispersity=2.6.

The dielectric constant of polymer (2) was 3.9

Example 3

Synthesis of the 4-isopropylcyano polytriarylamine homopolymer (3)

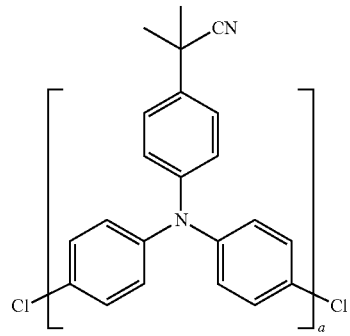

3(a): Synthesis of intermediate compound, 4-Iodophenylacetonitrile

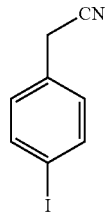

A round bottomed flask fitted with a magnetic stirrer was charged with 1.22 g of copper iodide (Sigma Aldrich), 25 g of 4-bromophenylacetonitrile (Apollo Scientific) and 38.37 g of sodium iodide (Sigma Aldrich) under argon. The round bottomed flask was evacuated and backfilled with argon three times. N,N'-Dimethylethylenediamine (1.38 mL, Sigma Aldrich) and 25 mL dioxane were added and the mixture was heated to 110° C. for 2 hours (h). The reaction was allowed to cool to room temperature (rt) and 125 mL of 30% aqueous ammonia was added. The mixture was then poured onto 500 mL water and extracted three times with dichloromethane (DCM) and the combined organics dried over $MgSO_4$. The solvent was removed under reduced pressure to afford the title compound as brown oil that solidified on standing. Yield: 29.97 g. $^1$H NMR (400 MHz, $CDCl_3$), δ 7.71 (2H, d, Ar—H), 7.08 (2H, d, Ar—H), 3.66 (2H, s, $CH_2$).

3(b): Synthesis of the intermediate compound 2-(4-iodophenyl)-2-methylpropanenitrile

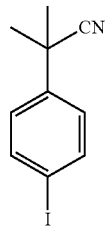

A three necked round bottom flask, fitted with a thermometer, argon inlet and stirrer bar, was charged with 15.82 g sodium tert-butoxide (Alfa-Aesar) in 25 mL tetrahydrofuran (THF, Univar) under argon and cooled to 0° C. N-Methylpyrrolidinone (NMP) (25 mL) was then added. A solution of 10 g of 4-iodophenylacetonitrile and 10.2 mL methyl iodide (Sigma Aldrich) in 22 mL THF:NMP (1:1, volume: volume (v/v)) was prepared and this was added to the cooled reaction mixture at such a rate as to keep the temperature below 10° C. On completion of the addition, the reaction was allowed to warm to rt and stirred for 2 h. 3M aqueous hydrochloric acid (HCl) (120 mL) was added followed by 120 mL toluene, the phases were separated and the aqueous layer extracted two more times with 120 mL toluene. The combined organic layers were washed with saturated aqueous sodium bicarbonate (120 mL), brine (120 mL), aqueous sodium thiosulfate solution (120 mL) and dried over $MgSO_4$. Removal of the solvent under reduced pressure gave the crude product as a brown oil. Purification by column chromatography in ethyl acetate/heptane mixtures gave the title compound as a pale yellow oil. Yield: 4.55 g. $^1$H NMR (400 MHz, $CDCl_3$), δ 7.71 (2H, d, Ar—H), 7.23 (2H, d, Ar—H), 1.70 (6H, s, $CH_3$).

3(c): Synthesis of intermediate compound Bis(4-chlorophenyl)amine

A 10 L jacketed vessel fitted with overhead stirrer, temperature probe, argon inlet and condenser was charged with 6.6 L of anhydrous toluene (Sigma Aldrich) and then degassed for 15 minutes. 7.46 g of palladium (II) acetate (Precious Metals Online) and 20.64 g of racemic 2,2'-bis (diphenylphosphino)-1,1'-binaphthyl (Alfa-Aesar) were added to the vessel, and the contents were heated to 50° C. with stirring, before being cooled back to room temperature once internal temperature reached 50° C., and left to stir for an hour. 4-chloroaniline (443.98 g, Alfa-Aesar), 4-chloroiodobenzene (794.49 g, Apollo Scientific) and sodium-tert-butoxide (318.63 g, Alfa-Aesar) were charged to the vessel and the contents were heated to reflux for 2 hours, whereupon HPLC analysis showed no remaining starting materials. The reaction was cooled to room temperature and washed with water (3.3 L), 2M aqueous hydrochloric acid (3.3 L), water (3.3 L) and brine (3.3 L). The organic phase was dried (sodium sulphate) and concentrated to give a brown solid. This was recrystallised in 6:1 methanol:water (total volume of 6.53 L) to give the product as a light brown solid. Yield: 362 g. $^1$H NMR (400 MHz, $CDCl_3$): δ 7.22-7.20 (4H, m, ArH), 6.96-6.94 (4H, m, ArH), 5.62 (1H, s, $Ar_2NH$)

3(d): Synthesis of 2-(4-(bis(4-chlorophenyl)amino) phenyl)-2-methylpropanenitrile; also called the 4-isopropylcyano-PTAA monomer

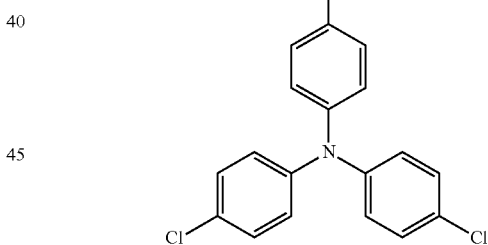

Palladium acetate (261 mg, Precious Metals Online) and (+/−) 2,2'-bis(diphenylphosphino)-1,1'-binaphthyl (723 mg, Alfa-Aesar) were added to 400 mL of degassed toluene which was then heated under argon to 45° C. over 30 minutes. The solution was cooled and 2-(4-iodophenyl)-2-methylpropanenitrile (28.6 g), bis-(4-chlorophenyl)amine (25.12 g) and sodium tert-butoxide (11.15 g) were added over ten minutes. On completion of addition, the reaction mixture was heated to reflux for 20 h. The reaction mixture was cooled, filtered through a silica plug and solvent removed under reduced pressure. Purification by column chromatography using EtOAc/heptane mixtures gave the product as a yellow solid. The product was then refluxed in methanol (150 mL) and filtered hot to give a cream solid. The solids from the filtrate were also collected and the combined solids recrystallised from 57 mL industrial methylated spirits (IMS): EtOAc (1:2, v/v), filtered and washed with IMS (30 mL) to give a cream solid. Yield: 10.5 g. $^1$H NMR (400 MHz, CDCl$_3$) δ 7.31 (2H, d, Ar—H), 7.21 (4H, d, Ar—H), 6.97-7.02 (6H, m, Ar—H), 1.71 (6H, s, 2×CH$_3$).

Synthesis of the 4-isopropylcyano-PTAA homopolymer (3)

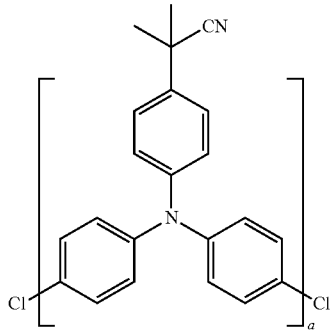

A 500 ml three neck round bottom flask was fitted with overhead stirrer, thermometer, air condenser, Claisen adaptor and septum inlet. The apparatus was flushed with argon. 150 mL of anhydrous N,N-dimethylacetamide (Sigma Aldrich) was charged to the vessel via cannula needle and was degassed with argon for 15 minutes. Triphenylphosphine (3.53 g, Sigma Aldrich), 2,2'-bipyridyl (169 mg, Sigma Aldrich), zinc (5.37 g, Alfa-Aesar) and nickel (II) chloride (99 mg, Sigma Aldrich) were added to the vessel and the contents were heated to 70-80° C. The solution turned red-brown and a few crystals of iodine were added to the mixture. The reaction was left to stir for 1 hour at this temperature before the monomer (10.8 g) and anhydrous toluene (18 mL, Sigma Aldrich) were added. The reaction was left to stir at 70-80° C. for 18 hours. The reaction was cooled to room temperature, causing the mixture to slowly gel. Once at room temperature, the mixture fully gelled. This was filtered, and the collected solid was dissolved in dichloromethane (500 mL) and filtered through celite, eluting with dichloromethane (2×500 mL). The filtrates were concentrated to give a damp residue, which was triturated in methanol (500 mL) and filtered to give a yellow solid. This solid was dissolved in dichloromethane (500 mL) with sonication and washed with 1M aqueous sodium hydroxide solution (250 mL) and water (3×250 mL), before drying (sodium sulphate) and concentrating to give a yellow solid. A solution of this material was prepared in dichloromethane (100 mL), requiring extended sonication, and filtered through a silica pad, eluting with dichloromethane. The filtrates were concentrated to give a yellow solid. This was dissolved in dichloromethane (50 mL), requiring extended sonication, and added slowly to a stirred portion of methanol (250 mL). The suspension was stirred for 2 hours, before being filtered, washed with the filtrate and methanol and dried to constant weight to give product as a yellow solid. Yield: 3.11 g.

The dielectric constant of polymer (3) was 5.9.

Example 4

Polymer (4), 50:50 4-isopropylcyano-PTAA: 2,4-dimethyl-PTAA copolymer

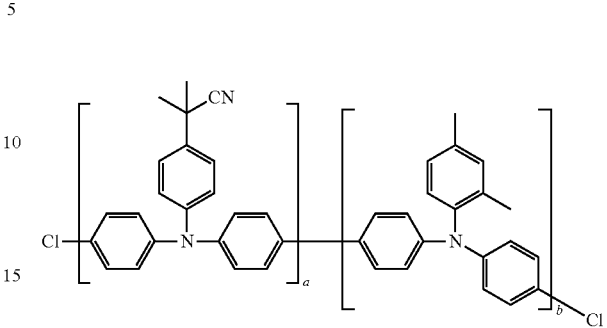

Synthesis of the 2,4-dimethyl PTAA monomer

A 10 L jacketed vessel fitted with overhead stirrer, temperature probe, argon inlet and condenser was charged with 4.5 L of toluene, which was degassed for 15 minutes. 5.56 g of palladium (II) acetate (Precious Metals Online) and 15.47 g of racemic 2,2'-bis(diphenylphosphino)-1,1'-binaphthyl (Alfa-Aesar) were charged to the vessel. The mixture was heated to 50° C. with stirring, and once the internal temperature reached 50° C., was cooled to room temperature. The mixture was left to stir at room temperature for 1 hour. 2,4-Dimethylaniline (300.03 g, Alfa-Aesar), 4-chloroiodobenzene (1306.51 g, Apollo Scientific) and sodium-tert-butoxide (523.87 g, Alfa-Aesar) were added and the reaction was heated at reflux for 24 hours, whereupon HPLC analysis showed complete reaction. The reaction was cooled to room temperature and washed twice with water (2×4 L) and the organic phase was filtered through celite, giving a second split, which was separated. The organics were then concentrated to give a brown solid (935.5 g). 838.46 g of this material was recrystallised from 3:1 industrial methylated spirits (IMS): ethyl acetate (4450 mL) in a 6 L jacketed vessel fitted with overhead stirrer, temperature probe, argon inlet and condenser. The suspension was cooled to 0° C. for 1 hour, then the solids collected by vacuum filtration and washed three times with cold 3:1 IMS:ethyl acetate (3×840 mL). The solids were dried overnight to give the product as a grey solid. Yield: 699 g. $^1$H NMR (300 MHz, CDCl$_3$): δ 7.16-6.86 (11H, m, ArH), 2.35 (3H, s, ArMe), 1.99 (3H, s, ArMe).

Synthesis of the 50:50 2,4-dimethyl: 4-isopropylcyano PTAA copolymer (4)

A 500 mL three neck round bottom flask was fitted with overhead stirrer, thermometer, air condenser, Claisen adaptor and septum inlet. The apparatus was flushed with argon. 200 mL of anhydrous N,N-dimethylacetamide (Sigma Aldrich) was charged to the vessel via cannula needle, and degassed with argon for 15 minutes. Triphenylphosphine (6.5 g, Sigma Aldrich), 2,2'-bipyridyl (0.29 g, Sigma Aldrich), zinc (9.52 g, Alfa-Aesar) and nickel (II) chloride (0.19 g, Sigma Aldrich) were added to the vessel. The contents were heated to 70-80° C. A few crystals of iodine were added to facilitate catalyst formation, turning the solution red-brown. The mixture was stirred at this temperature for a further hour. The 2,4-dimethyl monomer (8.12 g) and the 4-isopropylcyano monomer (9 g)

were added to the vessel, followed by anhydrous toluene (27.5 mL, Sigma Aldrich). The reaction was stirred at 70-80° C. for 20 hours, before being cooled to room temperature. The solids were collected by vacuum filtration and redissolved in toluene at 50° C. The mixture was cooled and the excess zinc was removed by filtration. The filtrates were washed with 1M aqueous sodium hydroxide solution (250 mL), water (250 mL) and 10% aqueous sodium chloride solution (250 mL), before being dried (sodium sulphate) and concentrated to give a yellow solid. This material was dissolved in toluene (100 mL) and filtered through silica, eluting with toluene. The filtrates were concentrated to give a yellow solid. The material was dissolved in toluene (250 mL) and charged to a 500 mL round bottom flask fitted with magnetic stirrer and condenser. Activated charcoal (0.4 g) was added and the mixture heated to 50° C. for 30 minutes. The mixture was filtered through filter paper in a Buchner funnel and washed with toluene. The carbon screening was repeated three times in total, filtering the third treatment through a glass sinter funnel. The filtrates were concentrated to give a yellow solid. A solution of this material was prepared in tetrahydrofuran (80 mL), which was added dropwise to a stirred portion of methanol (400 mL). The resulting suspension was stirred for 1 hour, before being collected by vacuum filtration, washing with methanol, and drying to a constant weight, to yield the product as a yellow powder.

Yield: 2.6 g. Mn=15091 g/mol. n=26. Polydispersity=1.18. The dielectric constant of polymer (4) was 4.1.

Example (5)

Polymer (5) 30:70 4-isopropylcyano-PTAA: 2,4-Dimethyl PTAA copolymer

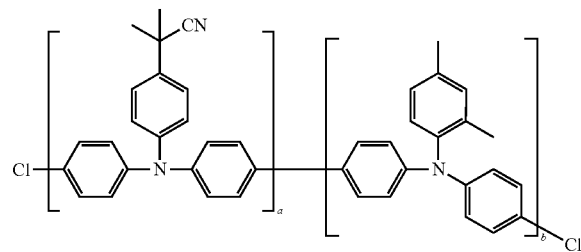

5(a): Synthesis of 4-Iodophenylacetonitrile

A mixture of potassium cyanide (33.23 g, Sigma-Aldrich) and 4-iodobenzyl bromide (101 g, Apollo Scientific) in 3:1 IMS/water (1 L) was heated to reflux for 2 hours then cooled to room temperature. The organics were removed in vacuo and the aqueous was extracted with EtOAc (2×750 mL). The combined organics were washed with brine (300 mL), dried (magnesium sulphate) and concentrated in vacuo to give the product as oil that solidified on standing. Yield: 78.4 g. $^1$H NMR (400 MHz, CDCl$_3$): δ 7.71 (2H, d, ArH), 7.08 (2H, d, ArH) 3.66 (2H, s, ArCH$_2$CN).

5(b): Synthesis of 2-(4-Iodophenyl)-2-methylpropanenitrile

NMP (197 mL, Sigma-Aldrich) was added to a suspension of sodium tert-butoxide (124.0 g, Alfa-Aesar) in THF (197 mL, Univar) under argon. The mixture was cooled to 0° C. and a solution of iodomethane (87.9 mL, Sigma-Aldrich) and 4-iodophenylacetonitrile (78.4 g) in a 50:50 mixture of NMP/THF (173 mL) was added dropwise keeping the internal temperature below 10° C. The mixture was warmed to room temperature and stirred overnight. 2M HCl (930 mL) and toluene (930 mL) were added then the aqueous layer was separated and extracted with toluene (2×465 mL). The combined organics were washed with saturated sodium bicarbonate (930 mL), brine (930 mL), 2M sodium thiosulfate (930 mL), dried (magnesium sulphate) and concentrated in vacuo to a yellow/orange solid. Purification by column chromatography eluting with EtOAc/heptane mixtures gave the title compound as a pale yellow oil. Yield 4.55 g, $^1$H NMR (400 MHz, CDCl$_3$): δ 7.71 (2H, d, Ar—H), 7.23 (2H, d, Ar—H), 1.70 (6H, s, CH$_3$).

5(c): 2-(4-(bis(4-chlorophenyl)amino)phenyl)-2-methylpropanenitrile:4-isopropyl-cyano-PTAA monomer Palladium acetate (261 mg, Precious Metals Online) and (±) 2,2'-bis(diphenylphosphino)-1,1'-binaphthyl (BINAP) (723 mg, Alfa-Aesar) were added to 400 mL of degassed toluene which was then heated under argon to 45° C. over 30 minutes. The solution was cooled and 2-(4-iodophenyl)-2-methylpropanenitrile (28.6 g), bis-(4-chlorophenyl)amine (25.12 g) and sodium tert-butoxide (11.15 g) (were added over ten minutes. On completion of addition, the reaction mixture was heated to reflux for 20 h. The reaction mixture was cooled, filtered through a silica plug and solvent removed under reduced pressure. Purification by column chromatography using EtOAc/heptane mixtures gave the product as a yellow solid. The product was then refluxed in methanol (150 mL) and filtered hot to give a cream solid. The solids from the filtrate were also collected and the combined solids recystallised from acetonitrile, washing the solids with acetonitrile (×2). Yield 10.5 g. $^1$H NMR (400 MHz, CDCl$_3$) δ 7.31 (2H, d, Ar—H), 7.21 (4H, d, Ar—H), 6.97-7.02 (6H, m, Ar—H), 1.71 (6H, s, 2×CH$_3$).

Synthesis of 30:70 4-isopropylcyano-PTAA: 2,4-Dimethyl PTAA copolymer

A 500 mL three neck round bottom flask was fitted with overhead stirrer, thermometer, air condenser, Claisen adaptor and septum inlet. The apparatus was flushed with argon. N,N-dimethylacetamide (278.5 mL, Sigma Aldrich) was charged and degassed for 15 minutes. Triphenylphosphine (10.74 g, Aldrich), 2,2'-bipyridyl (500 mg, Sigma Aldrich), zinc (15.85 g, Alfa-Aesar) and nickel (II) chloride (300 mg, Aldrich) were added to the vessel. The contents were heated to 70-80° C. where the mixture turned red-brown in colour. A few crystals of iodine were added, and the reaction was left to stir for 1 hour. The 2,4-dimethyl (18.87 g) and 4-isopropyl-cyano (8.99 g) monomers were added to the vessel. Anhydrous toluene (45 mL, Sigma Aldrich) was added. The reaction was left to stir at 70-80° C. for 19 hours, before being cooled to room temperature. The reaction was filtered, washing the solids with N,N-dimethylacetamide. The filter cake was dissolved in toluene (500 mL) and filtered through celite. The filtrates were washed with 1M sodium hydroxide solution (250 mL), water (250 mL) and 10% NaCl solution (250 mL), dried (sodium sulphate) and concentrated to give a yellow solid. This material was dissolved into toluene (250 mL) and filtered through silica, eluting with toluene. The silica was also flushed with tetrahydrofuran to remove all product from the pad. Product fractions were combined and concentrated to give a yellow solid (14.5 g). This was dissolved in toluene (500 mL) and charcoal treated. The filtrates were then concentrated to give a yellow solid. This material was dissolved in tetrahydrofuran (80 mL) and added dropwise to methanol (400 mL) with stirring. After stirring for 1 hour, the resulting suspension was collected by filtration to give a pale yellow powder. Yield: 9.9 g. Mn=9694 g/mol. n=34. Polydispersity=1.9.

The dielectric constant of polymer (5) was 3.7

Example 6

Polymer (6), 2,4-Dimethoxyphenyl-PTAA homopolymer

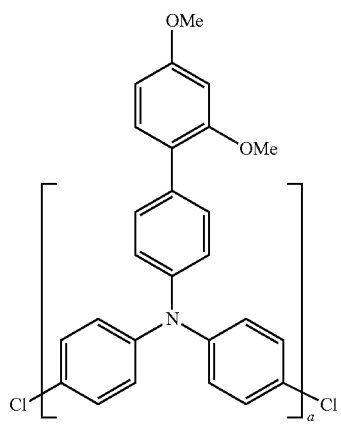

Synthesis of the 2,4-dimethoxyphenyl monomer

Tetrakis(triphenylphosphine)palladium(0) (Pd(PPh$_3$)$_4$) (6.62 g, Peakdale Molecular) was added to a mixture of 4-bromo-N,N-bis(4-chlorophenyl)aniline (Example 7a (i))(75 g), 2,4-dimethoxyboronic acid (38.2 g, Alfa-Aesar) and sodium carbonate (64.7 g) in tetrahydrofuran (1120 mL) and H$_2$O (750 mL) under argon and the mixture was heated to reflux overnight. The organics were separated, the aqueous layer was extracted with ethyl acetate (×2) and the combined organics were dried and concentrated to a black solid. The solid was adsorbed onto silica and columned eluting ethyl acetate/heptane mixtures to give a green/brown solid. Methanol was added and the mixture was stirred for 20 minutes then filtered and washed with methanol (×2). Methanol was added, the mixture was heated to 40° C. and dichloromethane was added portion wise until all solids had dissolved. The solution was stirred for 10 minutes, cooled in an ice-bath for 1 h then the solids were filtered, washed with 50:50 methanol/dichloromethane (×2) and dried to give the product as a light green/brown solid. Yield: 40.8 g. $^1$H NMR (400 MHz, CDCl$_3$): δ 7.40 (2H, d, ArH), 7.19-7.25 (5H, m, ArH), 7.00-7.05 (6H, m, ArH), 6.55 (2H, m, ArH), 3.84 (3H, s, OMe), 3.81 (3H, s, OMe).

Synthesis of the 2,4-dimethoxyphenyl-PTAA polymer

A 500 mL three neck round bottom flask was fitted with overhead stirrer, thermometer, air condenser, Claisen adaptor and septum inlet. The apparatus was flushed with argon. N,N-dimethylacetamide (150 mL, Sigma Aldrich) was charged and degassed for 15 minutes. Triphenylphosphine (4.54 g, Sigma Aldrich), 2,2'-bipyridyl (210 mg, Sigma-Aldrich), zinc (6.71 g, Alfa-Aesar) and nickel (II) chloride (130 mg, Sigma Aldrich) were added to the vessel and the contents were heated to 70-80° C. where the mixture turned red-brown in colour. A few crystals of iodine were added, and the reaction was left to stir for 1 hour. The monomer (15 g) was added to the vessel followed by anhydrous toluene (24 mL, Sigma-Aldrich). The reaction was left to stir for 15 hours before being cooled to room temperature. The reaction was filtered, washing the solids with N,N-dimethylacetamide. The filter cake was dissolved in dichloromethane (500 mL) and filtered through celite. The filtrates were washed with 1M hydrochloric acid (250 mL), water (250 mL) and 10% brine solution (250 mL), dried (magnesium sulphate) and concentrated to give a yellow solid. This material was dissolved into dichloromethane (500 mL) and filtered through silica, eluting with dichloromethane. Product fractions were combined and concentrated to give a yellow solid. This was dissolved in chloroform (250 mL) and charcoal treated. The filtrates were then concentrated to give a yellow solid. This material was dissolved in chloroform (150 mL) and added dropwise to a stirred portion of methanol (750 mL). The resulting suspension was stirred for 1 hour before being collected by filtration to give a pale yellow powder. Yield: 6.67 g. Mn=3368 g/mol. n=8.8. Polydispersity=2.4.

The dielectric constant of polymer (6) was 3.5

Example 7 polymer (7), 50:50 4-Isopropylcyanophenyl-PTAA: 2,4-Dimethyl PTAA copolymer

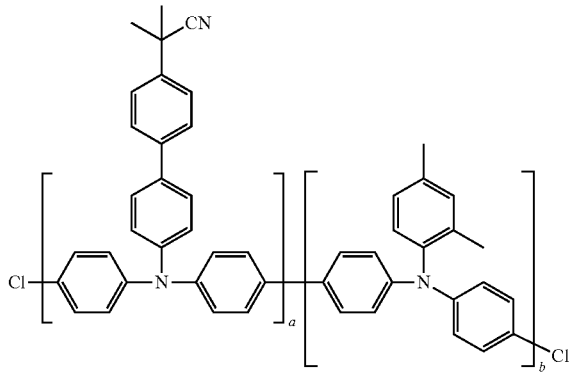

7 (a): Synthesis of the 4-Isopropylcyanophenyl-PTAA monomer (i) 4-bromo-N,N-bis(4-chlorophenyl) aniline A 5 L three neck flat bottomed flask, fitted with a condenser, thermometer and argon inlet, was flushed with argon. The flask was then charged with toluene (1.4 L), bis(4-chlorophenyl)amine, Compound of Example 3(c), (40 g), 4-bromo iodobenzene (52.3 g, Apollo Scientific), tris(dibenzylideneacetone)dipalladium(0)Pd$_2$-(dba)$_3$) (461 mg, Acros), (±)-2,2'-bis(diphenylphosphino)-1,1'-binaphthyl (1.05 g, Alfa-Aesar) and sodium-tert-butoxide (35.5 g, Alfa-Aesar). The resulting black solution was heated to 100° C. for 48 hours then cooled and filtered through a pad of celite, washing with toluene. The filtrate was concentrated to approximately half volume before washing with water (1 L), saturated brine (14 drying over MgSO₄ and concentrating to a green oil. Purification by dry flash column chromatography eluting with ethyl acetate/heptane mixtures followed by recrystallisation from acetonitrile gave the target compound. Yield: 32 g, off-white solid. $^1$H NMR (400 MHz, CDCl$_3$): δ 7.35 (2H, m, Ar—H), 7.20 (4H, m, Ar—H), 6.98 (4H, m, Ar—H), 6.92 (2H, m, Ar—H).

(ii) 4-(bis(4-chlorophenyl)amino)phenyl) boronic acid

A three neck round bottomed flask was fitted with a thermometer, argon inlet and a pressure equalizing dropping funnel. The flask was charged with anhydrous 2-methyltetrahydrofuran (1.1 L) and 4-bromo-N,N-bis(4-chlorophenyl) aniline (60.9 g) before being cooled to −78° C. n-Butyllithium (1.95M solution in hexanes, 95.4 mL) was added dropwise and the solution was stirred at −78° C. for 1 hour. Trimethyl borate (26 mL, Sigma-Aldrich) was then added dropwise via syringe and the reaction left to stir at −78° C. for 1.5 hours then warmed to room temperature overnight. 1M hydrochloric acid (630 mL) was added portionwise to the reaction mixture, the layers were split and the organics washed with water (600 mL), brine (600 mL), dried over MgSO₄ and concentrated to a pale yellow solid. The solid was slurried in heptane and stirred at room temp. for 1 hour. The solid was filtered off and washed with heptane before being dried under vacuum to give a pale yellow powder. Yield: 39.3 g. $^1$H NMR (400 MHz, CDCl$_3$): δ 8.02 (2H, m, Ar—H), 7.27 (4H, m, Ar—H), 7.05 (6H, m, Ar—H).

(iii) 2-(4'-(bis(4-chlorophenyl)amino)-[1,1'-biphenyl]-4-yl)-2-methylpropanenitrile A 2 L flat bottomed flask fitted with an argon inlet and condenser was charged with (4-(bis(4-chlorophenyl)amino) phenyl)boronic acid (39.3 g), 2-(4-odophenyl)-2-methylpropanenitrile, compound from Example 5 (c) (27.1 g) and tetrahydrofuran (591 mL). Sodium carbonate (33.9 g) was dissolved in water (393 mL) and this was added to the tetrahydrofuran mixture. The reaction mixture was then heated to 75° C. for 16 hours. Ethyl acetate (200 mL) and water (200 mL) were added and the mixture filtered through a celite pad. The layers were split, the organic layers washed with brine (600 mL), dried over MgSO₄ and concentrated. The resulting material was purified by flash column chromatography eluting with ethyl acetate/heptane mixtures. The fractions were concentrated to a thick slurry and the solid filtered off, washed with heptane and dried under vacuum to give an off-white solid. Yield: 27 g. $^1$H NMR (400 MHz, CDCl$_3$): δ 7.56-7.42 (6H, m, Ar—H), 7.21 (4H, m, Ar—H), 7.15-7.02 (6H, m, Ar—H), 1.77 (6H, s, CH$_3$).

Isopropylcyanophenyl-PTAA:2,4-dimethyl-PTAA 50:50 copolymer

A 250 mL three-necked round bottom flask was fitted with overhead stirrer, thermometer, air condenser, Claisen adaptor and septum inlet. The apparatus was flushed with argon. N,N-dimethylacetamide (128 mL, Sigma Aldrich) was charged and degassed for 15 minutes. Triphenylphosphine (4.17 g, Sigma Aldrich), 2,2'-bipyridyl (191 mg, Sigma-Aldrich), zinc (6.16 g, Alfa-Aesar) and nickel (II) chloride (120 mg, Sigma Aldrich) were added to the vessel. The contents were heated to 70-80° C. where the mixture turned red-brown in colour. A few crystals of iodine were added, and the reaction was left to stir for 1 hour. The 2,4-dimethyl monomer (5.8 g) and 2-(4'-(bis(4-chlorophenyl)amino)-[1,1'-biphenyl]-4-yl)-2-methylpropanenitrile (7.0 g) were added to the reaction followed by anhydrous toluene (21 mL, Sigma Aldrich) and the reaction was stirred at this temperature for 16 hours. The reaction was cooled and the solids were filtered off, washing with N,N-dimethylacetamide. Toluene (600 mL) was added and the mixture was heated to 50° C. then filtered through a pad of celite. The remaining solids were dissolved in dichloromethane (500 mL), warmed to 40° C. then filtered through a pad of celite. The toluene filtrates were concentrated to a sticky solid, dichloromethane (500 mL) was added and combined with the previous dichloromethane filtrates. The combined organics were washed with 1M aqueous sodium hydroxide (800 mL), water (800 mL), 10% brine (800 mL), dried over MgSO₄ and concentrated. The resulting solid was dissolved in dichloromethane (250 mL) and passed through a silica pad, washing with dichloromethane. The combined fractions were concentrated to a solid which was dissolved in tetrahydrofuran (400 mL) and charcoal treated and concentrated to a yellow solid. The solid was dissolved in tetrahydrofuran (100 mL) and added dropwise to methanol (500 mL), filtered and dried under vacuum to give the target compound. Yield: 4.85 g. Mn=7139 g/mol. n=10.8. Polydispersity=1.59.

The dielectric constant of polymer (7) was 4.0

Example 8

Polymer (8), 4-cyclohexylcyano-PTAA homopolymer

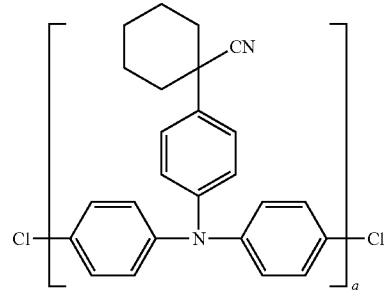

Synthesis of the 4-cyclohexylcyano PTAA oligomer 1-(4-iodophenyl)cyclohexanecarbonitrile N-Methylpyrrolidinone (NMP) (197 mL, Sigma-Aldrich) was added to a suspension of sodium tert-butoxide (124.0 g, Alfa-Aesar) in tetrahydrofuran (THF) (197 mL, Univar) under argon. The mixture was cooled to 0° C. and a solution of 1,5-dibromopentane (87.9 mL, Sigma-Aldrich) and 4-iodophenylacetonitrile (78.4 g) in a 50:50 mixture of NMP/THF (173 mL) was added dropwise keeping the internal temperature below 10° C. The mixture was warmed to room temperature and stirred overnight. 2M hydrochloric acid (930 mL) and toluene (930 mL) were added then the aqueous layer was separated and extracted with toluene (2×465 mL). The combined organics were washed with saturated sodium bicarbonate (930 mL), brine (930 mL), 2M sodium thiosulfate (930 mL), dried (magnesium sulphate) and concentrated in vacuo to a yellow/orange solid. Dichloromethane was added and the solid was filtered and washed with dichloromethane to give the product as a white solid. Yield: 22.55 g. $^1$H NMR (400 MHz, CDCl$_3$): δ 7.70-7.72 (2H, m, ArH), 7.22-7.25 (2H, m, ArH), 2.10-2.13 (2H, m, —CH$_2$—), 1.67-1.89 (7H, m, —CH—), 1.22-1.32 (1H, m, —CH—).

1-(4-(bis(4-chlorophenyl)amino)phenyl)cyclohexanecarbonitrile-4-cyclohexyl-cyano PTAA monomer A solution of palladium acetate (179 mg) and (±)-2,2'-bis(diphenylphosphino)-1,1'-binaphthyl (496 mg) in toluene (338 mL) was heated to 50° C. then cooled to room temperature. 1-(4-Iodophenyl)cyclohexanecarbonitrile (22.55 g), bis(4-chlorophenyl)amine (17.26 g) and sodium tert-butoxide (7.66 g) were added and the mixture was heated to reflux overnight. The mixture was cooled to room temperature, filtered through a pad of silica then concentrated in vacuo to an oil. Purification by column chromatography eluting ethyl acetate/heptane mixtures followed by recrystallisation from IPA gave the product as a white solid. Yield: 12.5 g. $^1$H NMR (400 MHz, CDCl$_3$): δ 7.31-7.35 (2H, m, ArH), 7.19-7.23 (4H, m, ArH), 6.97-7.04 (4H, m, ArH), 2.14-2.17 (2H, m-CH$_2$—), 1.68-1.86 (7H, m, —CH$_2$—), 1.20-1.32 (1H, m, —CH—).

Synthesis of 4-cyclohexylcyano PTAA oligomer 500 ml three neck round bottom flask was fitted with overhead stirrer, thermometer, air condenser, Claisen adaptor and septum inlet. The apparatus was flushed with argon. N,N-dimethylacetamide (125 mL, Sigma-Aldrich) was charged and degassed for 15 minutes. Triphenylphosphine (4.04 g, Sigma-Aldrich), 2,2'-bipyridyl (200 mg, Sigma-Aldrich), zinc (6.00 g, Alfa-Aesar) and nickel (II) chloride (120 mg, Sigma-Aldrich) were added to the vessel and the contents were heated to 70-80° C. where the mixture turned red-brown in colour. A few crystals of iodine were added and the reaction was left to stir for 1 hour. The 4-cyclohexylcyano monomer (12.5 g) was added to the vessel followed by anhydrous toluene (20 mL, Sigma-Aldrich) and the reaction was left to stir for 19 hours before being cooled to room temperature. The reaction was filtered, washing the solids with N,N-dimethylacetamide. The filter cake was dissolved in dichloromethane (250 mL) and filtered through celite. The filtrates were washed with 1M sodium hydroxide (250 mL), water (250 mL), 10% NaCl solution (250 mL), dried (sodium sulphate) and concentrated to give a yellow solid. This material was dissolved into dichloromethane (250 mL) and filtered through silica, eluting with dichloromethane. Product fractions were combined and concentrated to give an off white solid (8 g). The solid was dissolved in chloroform (250 mL) and charcoal treated three times (3×0.8 g charcoal). The filtrates were then concentrated to give an off white solid. This material was dissolved in chloroform (125 mL) and added dropwise to a stirred portion of methanol (625 mL). The resulting suspension was stirred for 1 hour before being collected by filtration to give an off white powder. Yield: 6.5 g. Due to insolubility, no GPC data was obtained.

The dielectric constant of polymer (8) was 4.1.

Example 9 polymer (9), 30:70 isopropylcyano-PTAA: 2,4-Dimethyl PTAA Bis-aryl end terminated copolymer

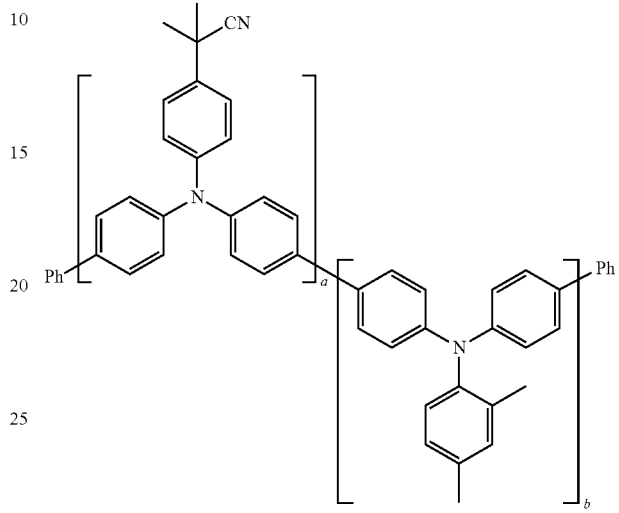

9(a): Synthesis of 2-(4-(bis(4-bromophenyl)amino)phenyl)-2-methylpropanenitrile (i)
2-(4-(diphenylamino)phenyl)-2-methylpropanenitrile

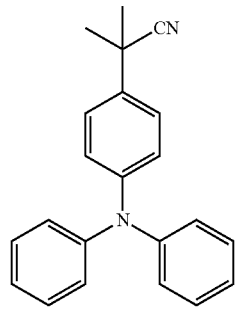 [SMILES: CC(C)(C#N)c1ccc(N(c2ccccc2)c2ccccc2)cc1]

Palladium(II) acetate (3.01 g, Precious Metals Online) and 4,5-bis(diphenylphosphino)-9,9-dimethylxanthene (7.76 g, Manchester Organics) were dissolved in toluene (550 mL) and the solution was degassed. Diphenylamine (22.7 g, Alfa-Aesar), sodium tert-butoxide (28.4 g, Alfa-Aesar) and 2-(4-iodophenyl)-2-methylpropanenitrile (40 g) were added and the solution heated to 90° C. for 18 hours. The reaction was cooled, filtered through a celite pad, washed with water, brine, dried (MgSO$_4$) and concentrated. The residue purified by flash column eluting ethyl acetate:heptane mixtures to give an oil. Heptane was added to the oil and the resulting solid was filtered to give the product as a white solid. Yield; 17.5 g. ¹H NMR (400 MHz, CDCl₃); 7.22-7.32 (9H, m), 7.00-7.10 (6H, m), 1.71 (6H, s)

(ii) 2-(4-(bis(4-bromophenyl)amino)phenyl)-2-methylpropanenitrile

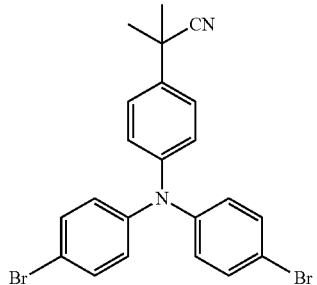 [SMILES: CC(C)(C#N)c1ccc(N(c2ccc(Br)cc2)c2ccc(Br)cc2)cc1]

2-(4-(diphenylamino)phenyl)-2-methylpropanenitrile (7.5 g) was dissolved in ethyl acetate (128 mL). N-Bromosuccinimide (NBS) (8.55 g, Apollo Scientific) was added portionwise before leaving the reaction to stir at room temperature for 18 hours. The reaction mixture was washed with water, sodium carbonate, brine, dried (MgSO₄) and concentrated. Heptane was added to the residue and the resulting solid was filtered off to give the product as a grey solid. Yield; 6.4 g. ¹H NMR (400 MHz, CDCl₃); 7.30 (6H, m), 7.04 (2H, d), 6.93 (4H, d), 1.71 (6H, s).

9(b): Synthesis of 2-(4-(bis(4-bromophenyl)amino)phenyl)-2-methylpropanenitrile (i) 2,4-dimethyl-N,N-diphenylaniline

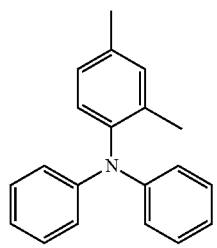 [SMILES: Cc1ccc(N(c2ccccc2)c2ccccc2)c(C)c1]

Toluene (735 mL) was degassed for 10 minutes then diphenylamine (15 g, Alfa Aesar), 4-iodoxylene 5 (21.6 g, Alfa-Aesar) and sodium tert-butoxide (10.65 g, Alfa Aesar) were added before degassing for a further 5 minutes. Pd₂(dba)₃ (812 mg, Acros) and tri-tert-butylphosphine (1.08 mL, Alfa Aesar) were added and the mixture was heated to 95° C. for 3.5 hours. The reaction was cooled, quenched with water (750 mL), stirred for 10 minutes then filtered through celite. The organic layer was separated, washed with brine (2×500 mL), dried (MgSO₄) and concentrated to a brown oil. Yield: 24.46 g. The oil was redissolved in toluene and passed through a silica plug. The filtrates were concentrated to give the title compound as a brown oil. ¹H NMR (400 MHz, CDCl₃): δ 7.16-7.23 (4H, m, ArH), 6.86-7.05 (9H, m, ArH), 2.33 (3H, s, CH₃), 2.00 (3H, s, CH₃).

(ii) N,N-Bis(4-bromophenyl)-2,4-dimethylaniline

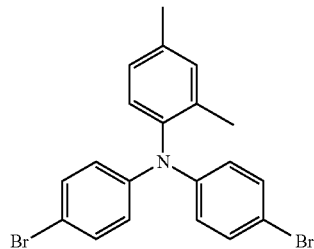

NBS (31.55 g, Apollo Scientific) was added to a solution of 2,4-dimethyl-N,N-diphenylaniline (24.23 g) in EtOAc (410 mL). The mixture slowly warmed over 5 minutes and was stirred for a further 1 hour until the solution had re-cooled. The mixture was washed with water (250 mL), Na₂CO₃ (2×375 mL), brine (250 mL), dried (MgSO₄) and concentrated to a dark brown solid. Recrystallisation from THF/MeCN gave the title compound as a grey solid. Yield: 27.70 g. ¹H NMR (400 MHz, CDCl₃): δ 7.22-7.30 (4H, m, ArH), 7.05 (1H, d, ArH), 7.00 (1H, dd, ArH), 6.95 (1H, d, ArH), 2.33 (3H, s, CH₃), 1.97 (3H, s, CH₃).

(c): Synthesis of 2,4-Dimethyl-N,N-bis(4-(4,4,5,5-tetramethyl-1,3,2-dioxaborolan-2-yl)phenyl)aniline

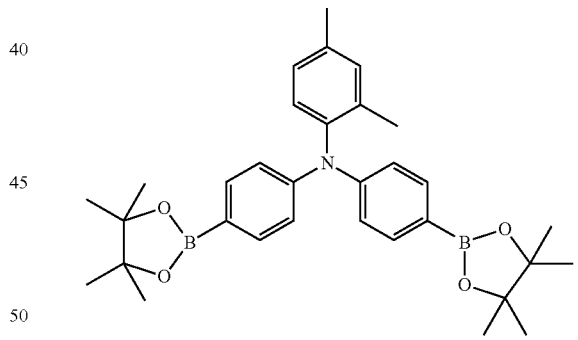

A mixture of N,N-bis(4-bromophenyl)-2,4-dimethylaniline 7 (10 g), bis(pinacolato)diboron (12.96 g, Allychem), and potassium acetate (7.97 g, Alfa-Aesar) in dioxane (250 mL) was degassed for 10 minutes then [1,1'-bis(diphenylphosphino)ferrocene]dichloropalladium (II) complex with dichloromethane (947 mg, Peakdale Molecular) was added and the mixture was heated to 100° C. overnight. The mixture was concentrated and the residue was dissolved in DCM (300 mL) and passed through a plug of celite. The filtrates were washed with water (2×200 mL), dried (MgSO₄) and concentrated to a dark brown solid.

Purification by column chromatography eluting with EtOAc/heptane mixtures followed by recrystallisation from THF/MeCN gave the title compound as a white solid. Yield:

5.60 g. $^1$H NMR (400 MHz, CDCl$_3$): δ 7.62-7.64 (4H, m, ArH), 6.92-7.05 (7H, m, ArH), 2.34 (3H, s, CH$_3$), 1.95 (3H, s, CH$_3$), 1.29 (24H, s, CH$_3$).

Synthesis of 30:70 4-isopropylcyano-PTAA: 2,4-Dimethyl-PTAA copolymer 9a

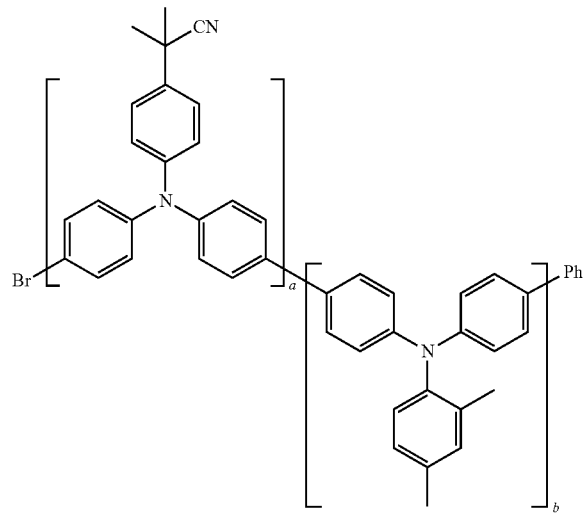

2-(4-(Bis(4-bromophenyl)amino)phenyl)-2-methylpropanenitrile (Example 9a (ii) (537.4 mg), N,N-bis(4-bromophenyl)-2,4-dimethylaniline (Example 9b (ii) (328.5 mg) and 2,4-dimethyl-N,N-bis(4-(4,4,5,5-tetramethyl-1,3,2-dioxaborolan-2-yl)phenyl)aniline (Example 9 (c) (1.01 g) were added to a mixture of toluene:dioxane:water (9.3 mL:4.6 mL:4.6 mL) followed by potassium phosphate (1.61 g, Alfa-Aesar) and Aliquat 336 (4 drops, Alfa Aesar). The mixture was degassed for 10 minutes then Pd$_2$(dba)$_3$ (8.8 mg, Acros) and tri(o-tolyl)phosphine] (17.4 mg, Sigma-Aldrich) were added and the mixture was heated to 90° C. until the required Mn was reached. Mn was determined by sampling the reaction every hour and analysing by GPC. At this point, the pinacolatoboron moieties were substituted by addition of bromobenzene (1.5 g, Sigma Aldrich) and heating the mixture at 90° C. overnight. The mixture was cooled, poured into MeOH (92.5 mL) and the precipitate was filtered and dissolved in toluene (100 mL). The solution was washed with 1M NaOH (92.5 mL), water (92.5 mL), brine (92.5 mL), dried (magnesium sulphate) and concentrated to give an orange solid. The solid was dissolved in toluene (10 mL) and filtered through a silica plug eluting THF:toluene (50:50). The filtrates were concentrated to an orange solid that was dissolved in THF (10 mL) and added dropwise to MeOH (50 mL). The suspension was stirred for 15 minutes then filtered to give a yellow solid that was dissolved in toluene, treated with charcoal (3×80 mg) and the filtrates were concentrated. The solid was dissolved in THF (10 mL) and added dropwise to MeOH (50 mL). The resulting solid was filtered and dried to give the title compound as a yellow solid. Yield: 620 mg. Mn=3900 g/mol. n=13.8. Polydispersity=2.29.

Synthesis of 30:70 4-isopropylcyano-PTAA: 2,4-Dimethyl-PTAA 9

Toluene (170 mL) was degassed for 10 minutes then 2-(4-(bis(4-bromophenyl)amino)phenyl)-2-methylpropanenitrile (2.70 g), N,N-bis(4-bromophenyl)-2,4-dimethylaniline (1.66 g) and 2,4-dimethyl-N,N-bis(4-(4,4,5,5-tetramethyl-1,3,2-dioxaborolan-2-yl)phenyl)aniline (5.01 g) were added followed by (Ph$_3$P)$_4$Pd (27.7 mg, Peakdale Molecular) and 1M Na$_2$CO$_3$ (95 mL). The mixture was heated to 95° C. until the required Mn was reached. Mn was determined by sampling the reaction and analysing by GPC. At this point, the pinacolatoboron moieties were substituted by addition of bromobenzene (7.5 g, Sigma Aldrich) and heating the mixture at 95° C. overnight. The mixture was then cooled and poured into methanol (1325 mL). The resulting suspension was collected by filtration, dissolved in toluene (250 mL) and filtered through celite. The filtrates were washed with 1M NaOH (250 mL), water (250 mL), brine (250 mL), dried (MgSO$_4$) and concentrated to give a yellow solid. To remove the bromide moieties, this was dissolved into degassed toluene (170 mL) and to it was added 1M Na$_2$CO$_3$ (95 mL), (Ph$_3$P)$_4$Pd (27.7 mg, Peakdale Molecular) and phenylboronic acid (5.81 g, Apollo Scientific). This was heated to 95° C. overnight. The workup was repeated as above, concentrating to 150 mL. This was filtered through silica, eluting with 50:50 toluene:THF mixture. The filtrates were concentrated to a brown solid which was dissolved in toluene (100 mL), treated with charcoal (3×500 mg) and the filtrates were concentrated. The solid was dissolved in THF (50 mL) and precipitated into MeOH (250 mL). The resulting suspension was filtered to yield the title compound as a grey solid. Yield: 4.0 g. Mn=1992 g/mol. n=7.0. Polydispersity=3.35.

The dielectric constant of polymer 9 was 3.6.

Alternative Method

Toluene (34 mL) was degassed for 10 minutes then 2-(4-(bis(4-bromophenyl)amino)phenyl)-2-methylpropanenitrile 4 (537.4 mg), N,N-bis(4-bromophenyl)-2,4-dimethylaniline 7 (328.7 mg) and 2,4-dimethyl-N,N-bis(4-(4,4,5,5-tetramethyl-1,3,2-dioxaborolan-2-yl)phenyl)aniline 8 (1.00 g) were added followed by (Ph$_3$P)$_4$Pd (5.7 mg, Peakdale Molecular) and 1M Na$_2$CO$_3$ (19 mL). The mixture was heated to 95° C. for 12 hours then the pinacolatoboron moieties were substituted by addition of bromobenzene (1.5 g, Sigma Aldrich) and heating the mixture at 95° C. overnight. The bromide moieties were then substituted by addition of phenylboronic acid (1.16 g, Apollo Scientific) and heating the mixture overnight. Purification as above gave the product as a grey solid. Yield: 825 mg. Mn=2300 g/mol. n=8.1. Polydispersity=3.1

Comparative Example (10)

Polymer (10) 2,4-dimethyl-PTAA polymer

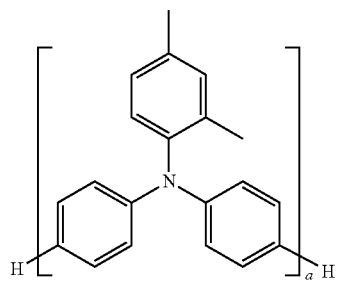

Synthesis of the 2,4-Dimethyl-polytriarylamine polymer (10)

A 1 L three neck round bottom flask was fitted with overhead stirrer, thermometer, air condenser, Claisen adaptor and septum inlet. The apparatus was flushed with argon. 500 mL of anhydrous N,N-dimethylacetamide (Sigma Aldrich) was charged to the vessel using a cannula needle, and the solution was degassed with argon for 15 minutes. Triphenylphosphine (19.65 g, Sigma Aldrich), 2,2'-bipyridyl (0.92 g, Sigma Aldrich), zinc (29.65 g, Alfa-Aesar) and nickel (II) chloride (0.51 g, Sigma Aldrich) were added and the reaction mass heated to 70-80° C., whereupon the mixture turned red-brown in colour. After 20 minutes, a few crystals of iodine were added and the mixture was left stirring at 70-80° C. for a further 40 minutes. The 2,4-dimethyl PTAA monomer (49.88 g, see Example 4) was added, followed by anhydrous toluene (75 mL, Aldrich). The reaction was left to stir at 70-80° C. for 19 hours. The reaction was cooled to room temperature and filtered. The solids were washed with the filtrate before being transferred back into the vessel and dissolved into toluene (500 mL) at 50° C. The mixture was cooled to room temperature, and the excess zinc was quenched by slow addition of concentrated hydrochloric acid (80 mL). The layers were separated and the organic phase washed with 10% aqueous sodium chloride solution (3×250 mL). The organic phase was then dried (sodium sulphate) and filtered through a celite pad. The filtrates were concentrated to give a yellow solid. This was dissolved in toluene (200 mL) and filtered through a pad of silica gel (100 g), eluting with toluene until no further product was seen by UV spot on a TLC plate. The filtrates were combined and concentrated to give a yellow solid. A solution of this solid in 150 mL of tetrahydrofuran was prepared and then added into a stirred portion of methanol (750 mL) over 1 hour. The suspension was stirred for 1 hour before being filtered, washed with methanol (2×100 mL) and dried to give a yellow powder. Yield: 25.78 g. Mn=3263 g/mol, n=12.0, polydispersity=1.7.

Hydrodechlorination Process

A 1 L autoclave fitted with magnetic stirrer was charged with 11.22 g of the 2,4-dimethyl-polytriarylamine polymer and 500 mL of toluene (Fisher Scientific). To this was added a slurry of 10% palladium on carbon (5.6 g, Sigma Aldrich) in water (90 mL). Triethylamine (17 mL, Alfa-Aesar) was added to this stirred solution and the reaction mixture hydrogenated at 300 psi/50° C. for 72 hours. After cooling and venting, the mixture was filtered through celite, eluting with toluene. The filtrates were washed with water (4×500 mL), dried (sodium sulphate) and concentrated to give a yellow solid. This material was dissolved in toluene (100 mL) and filtered through a silica pad, eluting with toluene until no further product was seen by a UV spot on a TLC plate. The filtrates were then concentrated to give a yellow solid. A 500 mL round bottom flask was charged with a solution of the product in toluene (250 mL) and activated charcoal (1.2 g). The mixture was heated to 60° C. for 30 minutes, then filtered hot through a Buchner funnel, washing with the minimum amount of toluene. This carbon screening process was repeated twice more, filtering the third treatment through a glass sinter. The filtrates were concentrated to give a dark yellow solid. A solution of this material in tetrahydrofuran (60 mL) was prepared and added slowly to a stirred portion of methanol (300 mL). The resulting suspension was stirred for 1 hour, collected by vacuum filtration, washed with methanol (3×50 mL) and dried to give the product as a pale yellow powder. Yield: 9.75 g. Mn=3138 g/mol. n=11.6. Polydispersity=1.8. Chlorine content=19 ppm.

The permittivity of the 2,4-Dimethyl PTAA polymer (10) was 3.0

Comparative Examples (11)-3-Methoxy-PTAA and (12)-2,4-Difluoro-PTAA these polymers were synthesised using the same methodology as described in Examples 1 to 9. The permittivities of the corresponding PTAA polymers are listed in Table 1.

Comparative Example 13

Synthesis of the 3,5-bistrifluoromethyl polytriarylamine polymer (13)

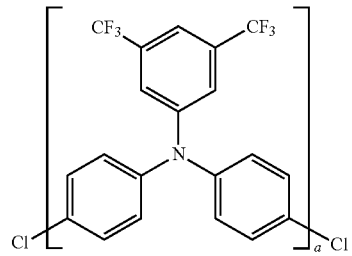

Synthesis of the 3,5-bis(trifluoromethyl) monomer

A 2 L 3-neck round bottom flask fitted with mechanical stirrer, thermometer, condenser and argon inlet was charged with toluene (1.125 L), palladium acetate (494.4 mg, Precious Metals) and (±)-2,2'-bis(diphenylphosphino)-1,1'-binaphthyl (1.37 g, Alfa-Aesar) were added to the vessel and the contents were heated to 50° C. and then cooled to room temperature once reached and left to stir for 1 hour. 3,5-bis(trifluoromethyl)iodobenzene (75 g, Maybridge), bis(4-chlorophenyl)aniline (52.5 g) and sodium-tert-butoxide (23.28 g, Alfa-Aesar) were added to the vessel which was heated to 110° C. for 8 hours. The reaction was cooled and water (750 mL) was added. The mixture was filtered and the layers separated. The organic phase was washed with water, filtered through a pad of celite and concentrated. The crude product was purified by chromatography using heptane as an eluent, followed by recrystallising twice from methanol. Yield: 35 g. $^{1}$H NMR (400 MHz, CDCl$_3$): δ 7.31-7.29 (7H, m, ArH), 7.04-7.02 (3H, m, ArH).

Synthesis of the 3,5-bis(trifluoromethyl) PTAA oligomer (13)

A 1 L three neck round bottom flask was fitted with overhead stirrer, thermometer, air condenser, Claisen adaptor and septum inlet. The apparatus was flushed with argon. N,N-dimethylacetamide (250 mL, Sigma-Aldrich) was charged and degassed for 15 minutes. Triphenylphosphine (7.58 g, Sigma-Aldrich), 2,2'-bipyridyl (346.2 mg, Sigma-Aldrich), zinc (11.17 g, Alfa-Aesar) and nickel (II) chloride (216.7 mg, Sigma-Aldrich) were added to the vessel. The contents were heated to 70-80° C. where the mixture turned red-brown in colour. A few crystals of iodine were added, and the reaction was left to stir for 1 hour. The 3,5-bis(trifluoromethyl) monomer (24.98 g) was added to the vessel. Anhydrous toluene (41 mL, Sigma-Aldrich) was added and the reaction was left to stir for 19 hours, before being cooled to room temperature.

The reaction was filtered, washing the solids with N,N-dimethylacetamide (100 mL). The filter cake was dissolved in tetrahydrofuran (300 mL), filtered through a celite pad and concentrated. This material was dissolved into tetrahydrofuran (250 mL) and filtered through silica, eluting with tetrahydrofuran. Product fractions were combined and concentrated to give a yellow solid. This was dissolved in 2-methyltetrahydrofuran (230 mL), washed with 1M sodium hydroxide solution (200 mL), water (200 mL), 10% sodium chloride solution (200 mL) and water (200 mL) before being concentrated to give a yellow solid (8.5 g). This was dissolved in tetrahydrofuran (50 mL) and charcoal treated three times (3×0.85 g of charcoal) then concentrated. This material was dissolved in tetrahydrofuran (60 mL) and added dropwise to a stirred portion of methanol (300 mL). The resulting suspension was stirred for 1 hour before being collected by filtration and dried. Yield: 7.5 g. Mn=5350 g/mol. n=14.1. Polydispersity=1.3.

The dielectric constant of polymer (13) was 2.8.

Comparative Example 14

Polymer (14), 2-Methoxy backbone PTAA homopolymer

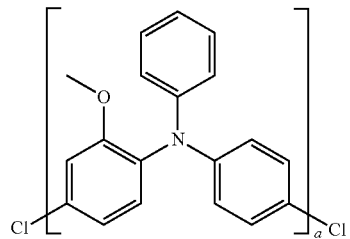

Synthesis of the 2-methoxy backbone PTAA monomer (a) Synthesis of 4-chloro-2-methoxyaniline A mixture of 5-chloro-2-nitroanisole (1.0 g, Sigma-Aldrich), ammonium formate (3.36 g, Alfa-Aesar) and 10% platinum on carbon (100 mg) in MeOH (10 mL) was heated to reflux for 45 minutes then cooled to room temperature and filtered through celite, washing with MeOH. The filtrates were concentrated and the residue was dissolved in EtOAc and water. The organics were dried (MgSO$_4$) and concentrated to a brown oil. The material was absorbed onto silica and columned eluting ethyl acetate/heptane mixtures to give the product as a brown oil. Yield: 0.7 g. $^1$H NMR (400 MHz, CDCl$_3$): δ 6.72-6.78 (2H, m, ArH), 6.58-6.62 (1H, m, ArH), 3.83 (3H, s, OMe).

(b) Synthesis of 4-chloro-N-(4-chlorophenyl)-2-methoxyaniline

A solution of palladium (II) acetate (949 mg, Precious Metals Online) and (+/−)-2,2'-bis(diphenylphosphino)-1,1'-binaphthyl (2.63 g, Alfa-Aesar) in toluene (1000 mL) was heated to 50° C. under argon then cooled to room temperature. 4-Chloro-2-methoxyaniline (66.6 g), 4-iodochlorobenzene (105.81 g, Apollo Scientific) and sodium tert-butoxide (44.68 g, Alfa-Aesar) were added and the mixture was heated to reflux for 90 minutes. The mixture was cooled to room temperature, quenched with water (500 mL) then the organics were separated, dried (MgSO$_4$) and concentrated. The residue was absorbed onto silica and columned eluting ethyl acetate/heptane mixtures to give the product as a dark orange oil that solidified on standing. Yield: 97.86 g. $^1$H NMR (400 MHz, CDCl$_3$): δ 7.18-7.23 (2H, m, ArH), 7.12 (1H, d, ArH), 7.00-7.05 (2H, m, ArH), 6.82-6.85 (2H, m, ArH), 6.00 (1H, br s, NH), 3.87 (3H, s, OMe).

(c) Synthesis of 4-chloro-N-(4-chlorophenyl)-2-methoxy-N-phenylaniline-2-MeO-backbone PTAA monomer Palladium(II) acetate (3.84 g, Precious Metals Online) and 4,5-bis(diphenylphosphino)-9,9-dimethylxanthene (9.91 g, Manchester Organics) were dissolved in toluene (690 mL) and stirred at room temperature under argon for 1 hour. 4-Chloro-N-(4-chlorophenyl)-2-methoxyaniline (45.9 g), iodobenzene (47.9 mL, Sigma-Aldrich) and sodium tert-butoxide (42.78 g, Alfa Aesar) were added and the mixture was heated to 85° C. overnight. The mixture was cooled to room temperature, quenched with water (690 mL) and filtered through celite. The organics were separated, dried (MgSO$_4$) and concentrated to a black oil. The material was absorbed onto silica and columned eluting ethyl acetate/heptane mixtures to give a brown oil. MeOH was added and the mixture was cooled to 0° C. and stirred for 1 hour. The solid was filtered and recrystallised from DCM/MeOH to give the product as a white solid. Yield: 14.5 g. $^1$H NMR (400 MHz, CDCl$_3$): δ 7.18-7.23 (2H, m, ArH), 7.10-7.15 (2H, m, ArH), 7.05 (1H, d, ArH), 6.89-6.99 (5H, m, ArH), 6.84-6.88 (2H, m, ArH), 3.63 (3H, s, OMe).

Synthesis of the 2-methoxy backbone PTAA polymer 14

A 500 mL three neck round bottom flask was fitted with overhead stirrer, thermometer, air condenser, Claisen adaptor and septum inlet. The apparatus was flushed with argon. N,N-dimethylacetamide (150 mL, Sigma-Aldrich) was charged and degassed for 15 minutes. Triphenylphosphine (5.75 g, Sigma-Aldrich), 2,2'-bipyridyl (263.1 mg, Sigma-Aldrich), zinc (8.48 g, Alfa-Aesar) and nickel (II) chloride (163.8 mg, Sigma-Aldrich) were added to the vessel and the contents were heated to 70-80° C. where the mixture turned red-brown in colour. A few crystals of iodine were added, and the reaction was left to stir for 1 hour. The monomer (14.5 g) was added to the vessel followed by anhydrous toluene (24 mL, Sigma-Aldrich) and the mixture was left to stir overnight before being cooled to room temperature. The reaction was filtered and the filtrates were added dropwise to MeOH (1150 mL). The solids were filtered, washed with MeOH and dried before being redissolved in toluene (750 mL). The solution was washed with 1M hydrochloric acid (250 mL), water (250 mL), 10% brine (250 mL), dried (MgSO$_4$) and concentrated to give a yellow solid. This was dissolved in toluene and passed through a silica pad eluting toluene then 50:50 toluene:THF. The filtrates were concentrated then redissolved in toluene and charcoal treated (3×1.24 g). The filtrates were then concentrated to give a yellow solid. This material was dissolved in THF (250 mL) and added dropwise to a stirred portion of methanol (1250 mL). The resulting suspension was stirred for 30 minutes before being collected by filtration to give a pale yellow powder. Yield: 8.93 g. Mn=3221 g/mol. n=11.8. Polydispersity=2.43.

The dielectric constant of poymer (14) was 3.29

Comparative Example 15

Polymer (15) 4-Phenoxy-PTAA homopolymer

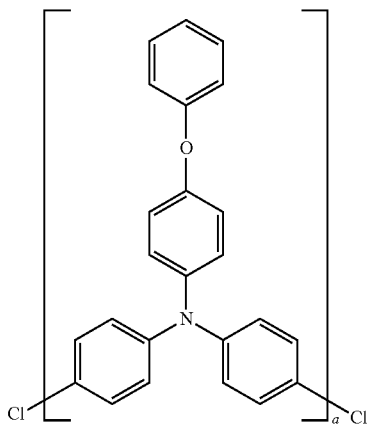

Synthesis of the 4-phenoxy monomer

A 1 liter 3-neck round bottom flask fitted with magnetic stirrer, thermometer, condenser and argon inlet was charged with 300 mL toluene, palladium acetate (250 mg, Precious Metals) and (±)-2,2'-bis(diphenylphosphino)-1,1'-binaphthyl (0.69 grams (g), Alfa-Aesar) were added to the vessel and the contents were heated to 50° C. and then cooled to room temperature once reached and left to stir for 1 hour. 4-phenoxyaniline (20.02 g, Alfa-Aesar), 4-chloroiodobenzene (59.96 g, Apollo Scientific) and sodium-tert-butoxide (22.83 g, Alfa-Aesar) were added to the vessel which was heated to 110° C. for 54 hours. The reaction was cooled and water (200 ml) was added. The mixture was filtered and the layers separated. The organic phase washed with water, filtered through a pad of celite, dried over sodium sulphate and concentrated. The crude product was purified by automated chromatography, using 2% ethyl acetate in heptane as an eluent, and then by silica pad using heptane to remove impurities and then 10% ethyl acetate in heptane. Product fractions were combined and concentrated Yield: 29 g. $^1$H NMR (400 MHz, CDCl$_3$): δ 7.5-6.9 (17H, m, ArH)

Synthesis of the 4-phenoxy PTAA oligomer

A 500 ml three neck round bottom flask was fitted with overhead stirrer, thermometer, air condenser, Claisen adaptor and septum inlet. The apparatus was flushed with argon. N,N-dimethylacetamide (130 mL, Aldrich) was charged and degassed for 15 minutes. Triphenylphosphine (1.50 g, Aldrich), 2,2'-bipyridyl (69.8 mg, Aldrich), zinc (2.24 g, Alfa-Aesar) and nickel (II) chloride (42.4 mg, Aldrich) were added to the vessel. The contents were heated to 70-80° C. where the mixture turned red-brown in colour. A few crystals of iodine were added, and the reaction was left to stir for 1 hour. The monomer (13 g) was added to the vessel, followed by anhydrous toluene (45.5 mL, Aldrich). After 3 hours, further nickel (II) chloride (42.8 mg) was added and the reaction was left to stir for 15 hours, before being cooled to room temperature. The reaction was filtered through celite, eluting with N,N-dimethylacetamide (50 mL). Solids began precipitating in the filtrates which were collected by filtration. The filtrates were measured (350 mL) and added dropwise to a stirred portion of methanol (1750 mL). The suspension was stirred for 1 hour, collected by vacuum filtration and washed with methanol. The solids were combined with the solids collected from the celite filtration and dissolved in tetrahydrofuran (250 mL), washed three times with 10% sodium chloride solution (200 ml) and concentrated to give a yellow solid. This material was dissolved into tetrahydrofuran (250 mL) and filtered through silica, eluting with tetrahydrofuran. Product fractions were combined and concentrated to give a yellow solid (15 g). This material was dissolved in tetrahydrofuran (250 mL) and charcoal treated three times (3×1.5 g of charcoal). The filtrates were concentrated. This material was dissolved in tetrahydrofuran (120 mL) and added dropwise to a stirred portion of methanol (120 mL). The resulting suspension was stirred for 1 hour before being collected by filtration and dried. Yield: 8.6 g. Mn=2047 g/mol. n=6.1. Polydispersity=2.1.

The dielectric constant of polymer (15) was 2.7.

The invention claimed is:

1. A semiconducting polymer having a permittivity greater than 3.4 at 1000 Hz and a charge mobility in the pure state of greater than $10^{-7}$ cm$^2$V$^{-1}$S$^{-1}$, wherein the semiconducting-polymer comprises substituted triarylamine repeat units, and wherein the substituted triarylamine repeat units comprise at least one of the following attributes:
   (i) indirectly substituted by at least one cyano group, wherein the at least one cyano group is attached to an aromatic group of a substituted triarylamine by a linking group;
   (ii) directly substituted by at least two alkoxy groups, wherein the at least two alkoxy groups are in the 2, 4 or 6 positions of a pendant aromatic ring; and combinations thereof.

2. The semiconducting polymer according to claim 1, wherein the triarylamine repeat units comprise at least one of the following structures:

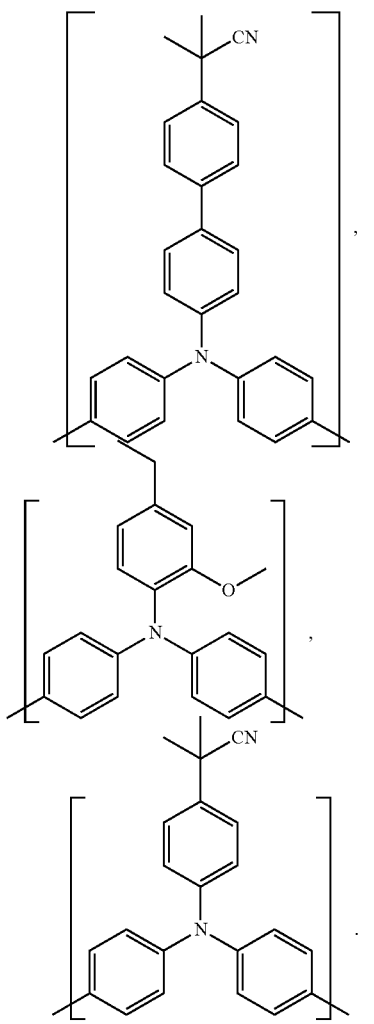

3. The semiconducting polymer according to claim 1, wherein the semiconducting polymer is represented by Formula (I) comprising first monomer units, second monomer units, and combinations thereof:

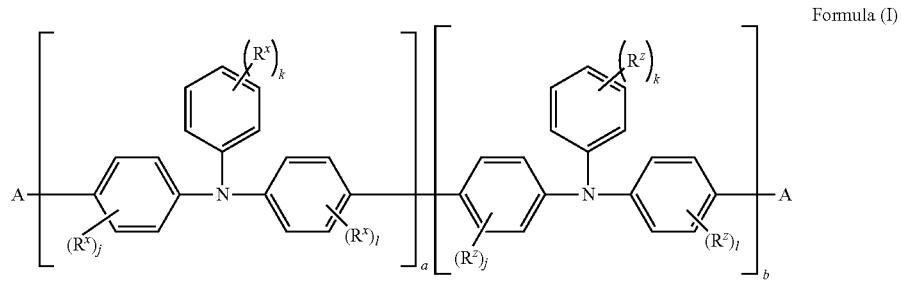

Formula (I)

wherein each $R^x$ is independently selected from the group consisting of hydrogen, an alkyl group, an alkoxy group, halogen, a nitro group, $R^y$, and combinations thereof;
wherein each $R^y$ is independently an organic group that includes at least one CN group, with the proviso that at least one repeat unit in the semiconducting polymer includes an $R^y$ group;
wherein the sum of indices (j+k+l) is at least one;
wherein each $R^z$ is independently an alkyl group optionally substituted by at least one substituent selected from the group consisting of hydroxyl, alkoxy, alkylsulphonyl, halogen, cyano, nitro, amino, carboxyl, and combinations thereof;
wherein each A is independently selected from the group consisting of hydrogen, halogen any suitable end-capping group, and combinations thereof;
wherein j and l are independently in each occurrence 0 to 4;
wherein k is independently in each occurrence 0 to 5;
wherein a is the number of first monomer units; and
wherein b is the number of second monomer units, which may be 0.

4. A semiconducting polymer according to claim 1, wherein the semiconducting polymer is represented by Formula (I) comprising first monomer units, second monomer units, and combinations thereof:

wherein each $R^x$ is independently selected from the group consisting of hydrogen, an alkyl group, an alkoxy group, halogen, a nitro group, $R^y$, and combinations thereof;
wherein each $R^y$ is independently selected from the group consisting of a cyano group (CN), an organic group that includes at least one CN group, and combinations thereof;
wherein the semiconducting polymer comprises at least two alkoxy substituents $R^x$ in the 2, 4 or 6 positions of a pendant aromatic ring;
wherein the sum of indices (j+k+l) is at least one;
wherein each $R^z$ is independently an alkyl group optionally substituted by at least one substituent selected from the group consisting of hydroxyl, alkoxy, alkylsulphonyl, halogen, cyano, nitro, amino, carboxyl, and combinations thereof;
wherein each A is independently selected from the group consisting of hydrogen, halogen, any suitable end-capping group, and combinations thereof;
wherein j and l are independently in each occurrence 0 to 4;
wherein k is independently in each occurrence 0 to 5;
wherein a is the number of first monomer units; and
wherein b is the number of second monomer units, which may be 0.

5. The semiconducting polymer according to claim 4, wherein methoxy groups are substituted in the 2- and 4-positions on the pendant aromatic ring.

6. The semiconducting polymer according to claim 1, wherein the semiconducting polymer is a copolymer represented by the following formula:

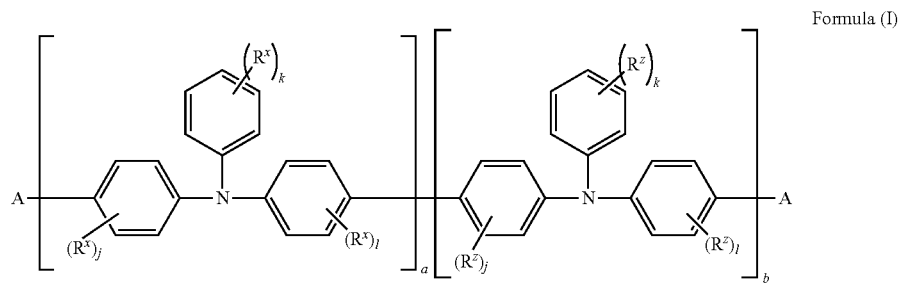

Formula (I)

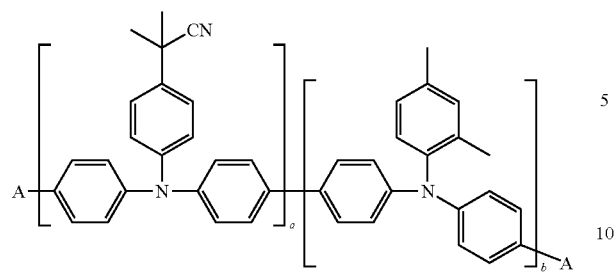
wherein a is the number of first monomer units,
wherein b is the number of second monomer units, and
wherein each A is independently selected from the group consisting of hydrogen, halogen, any suitable end-capping group, and combinations thereof.
* * * * *